United States Patent [19]
Ishikawa

[11] Patent Number: 5,883,514
[45] Date of Patent: Mar. 16, 1999

[54] MR IMAGING APPARATUS

[75] Inventor: Akihiro Ishikawa, Kyoto, Japan

[73] Assignee: Shimadzu Corporation, Kyoto, Japan

[21] Appl. No.: 803,605

[22] Filed: Feb. 21, 1997

[30] Foreign Application Priority Data

Feb. 29, 1996 [JP] Japan .................................... 8-070977

[51] Int. Cl.$^6$ .............................................. G01V 3/00
[52] U.S. Cl. ........................................ 324/309; 324/307
[58] Field of Search .................................... 324/309, 307, 324/312, 314, 300

[56] References Cited

U.S. PATENT DOCUMENTS

| | | | |
|---|---|---|---|
| 5,270,654 | 12/1993 | Feinberg et al. | 324/309 |
| 5,612,619 | 3/1997 | Feinberg | 324/309 |
| 5,647,362 | 7/1997 | Fuderer et al. | 324/309 |
| 5,680,045 | 10/1997 | Feinberg | 324/309 |
| 5,779,636 | 7/1998 | Kanazawa | 324/309 |

OTHER PUBLICATIONS

GRASE (Gradient–and Spin–Echo) Imaging: A Novel Fast MRI Technique, Magnetic Resonance in Medicine 20, pp. 344–349 (1991).

*Primary Examiner*—Louis Arana
*Attorney, Agent, or Firm*—Nikaido, Marmelstein, Murray & Oram LLP

[57] ABSTRACT

An MR imaging apparatus using NMR phenomenon includes a main magnet, a first, a second and a third gradient field coils, a RF coil, a RF emitter, a slice-selecting gradient field pulse generator, a reading gradient field pulse generator, a phase-encoding gradient field pulse generator, a designating device and a data processor. The phase-encoding gradient field pulse generator varies strengths of phase-encoding gradient field pulses such that, when a reference spin echo signal is placed in a middle position in a spin echo group and is first in the order within the spin echo group, phase encode amounts of the spin echo signals successively increase from the reference spin echo signal according to the order within the spin echo group. The strengths of the phase-encoding gradient field pulses are varied for gradient echo signals such that integrated phase encode amounts have absolute values successively decreasing according to the order, a direction in which the absolute values of the integrated phase encode amounts change is switched alternately with extension of a period of time, and the absolute values are greater than the absolute values of the integrated phase encode amounts of a gradient echo group having a shorter period of time.

10 Claims, 21 Drawing Sheets

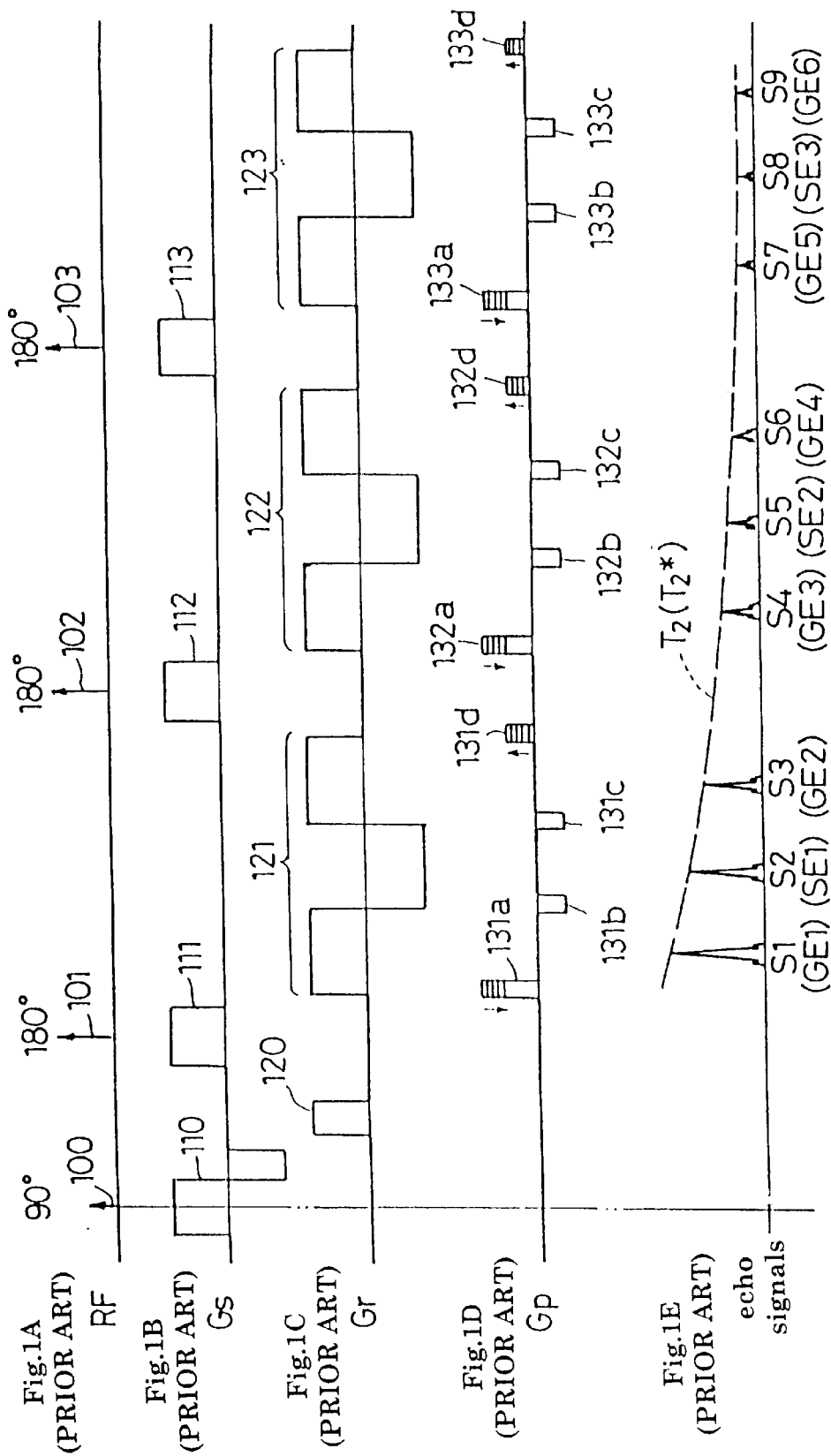

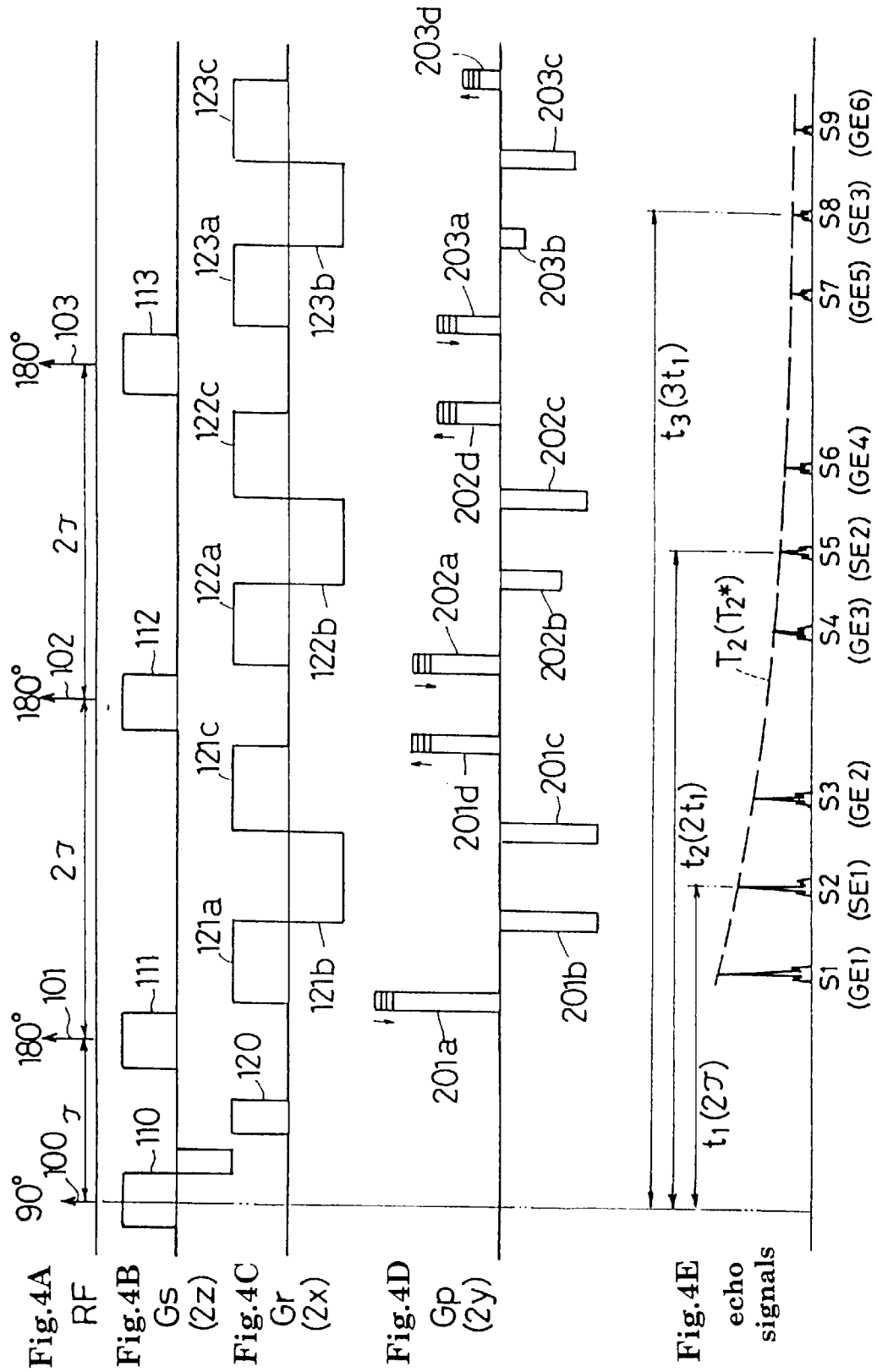

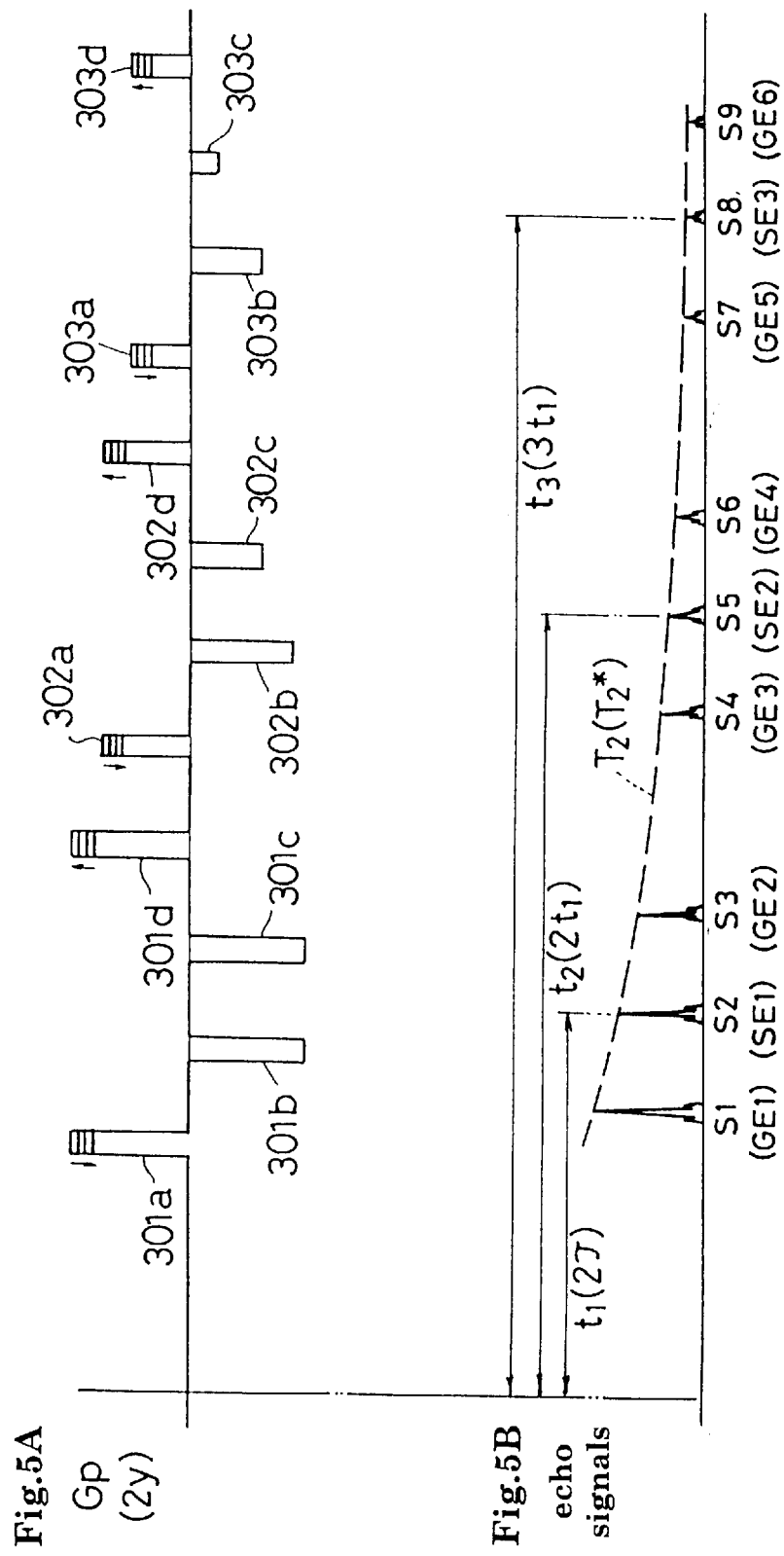

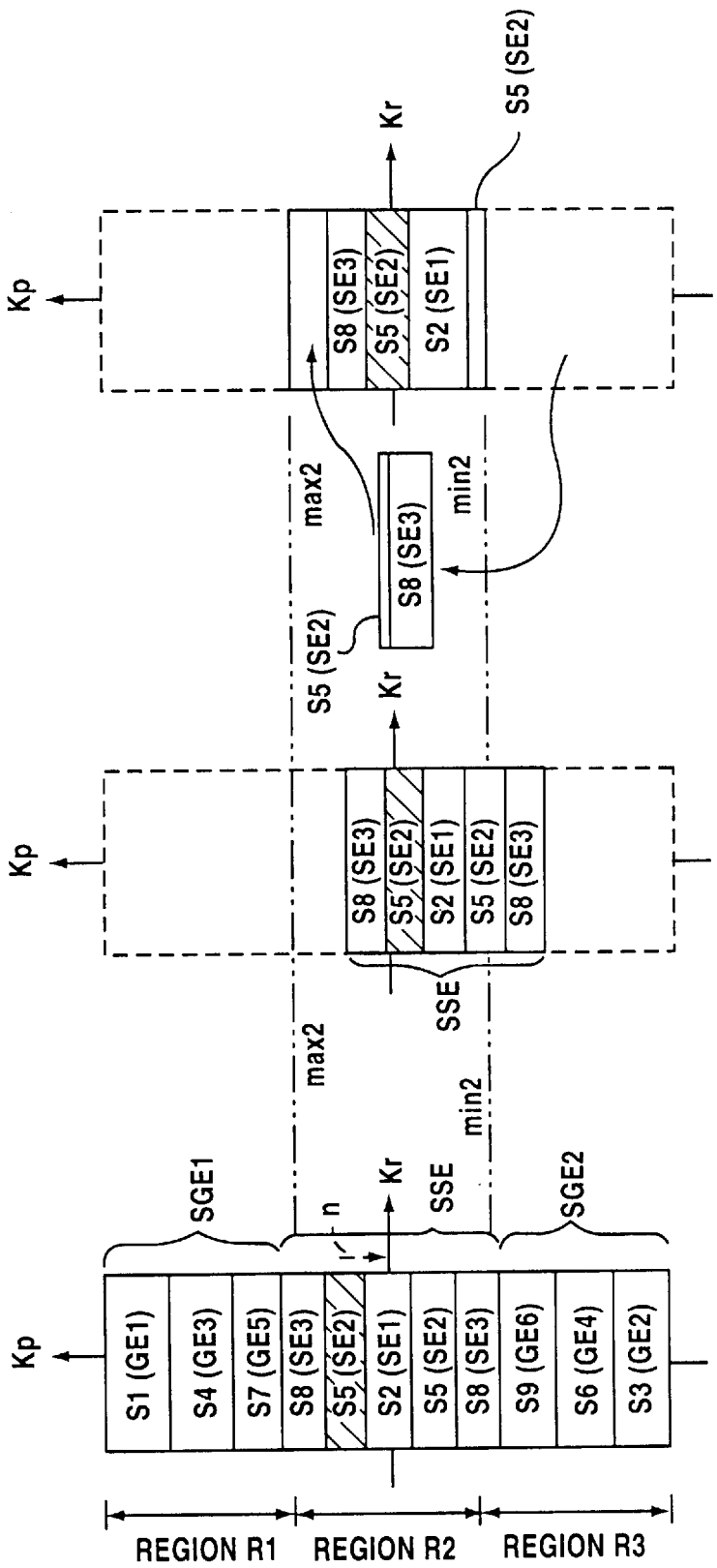

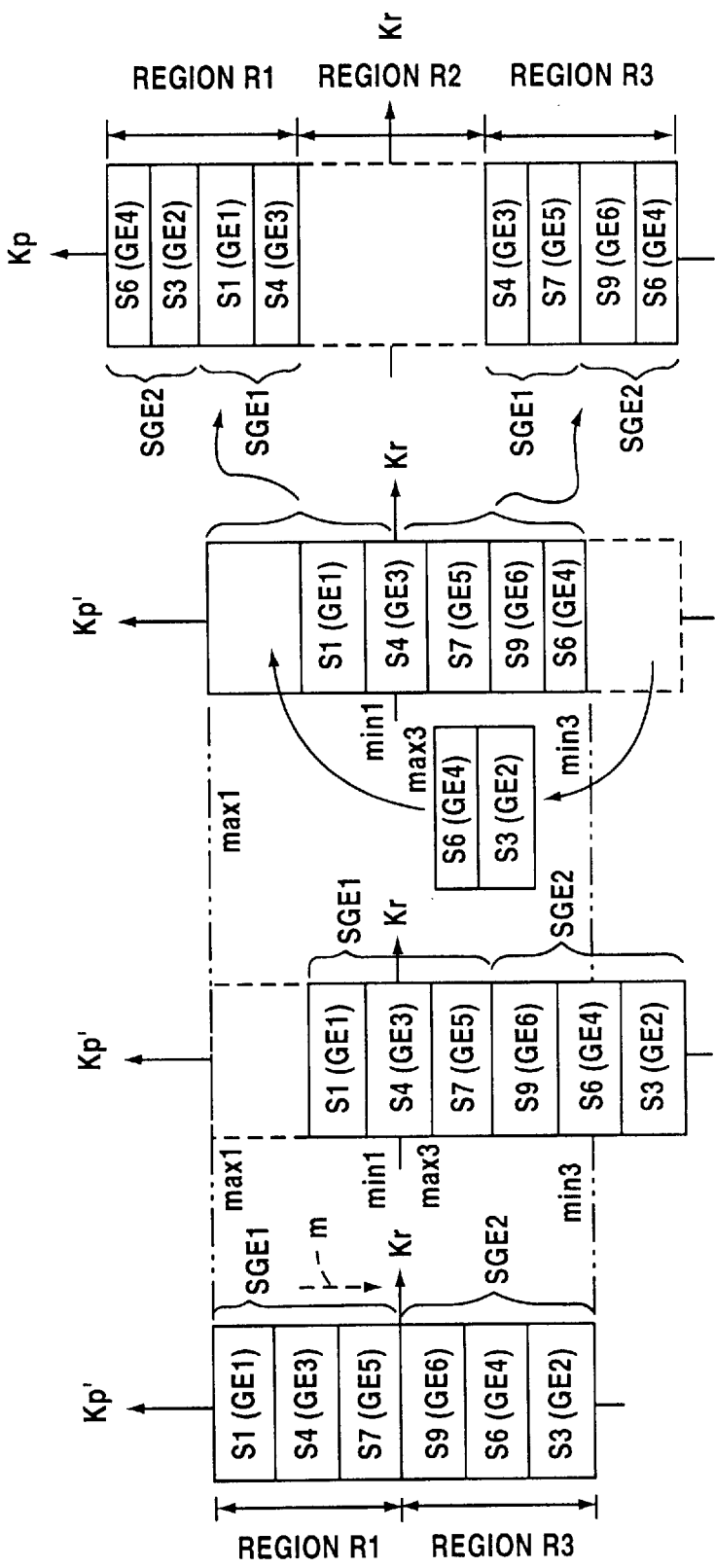

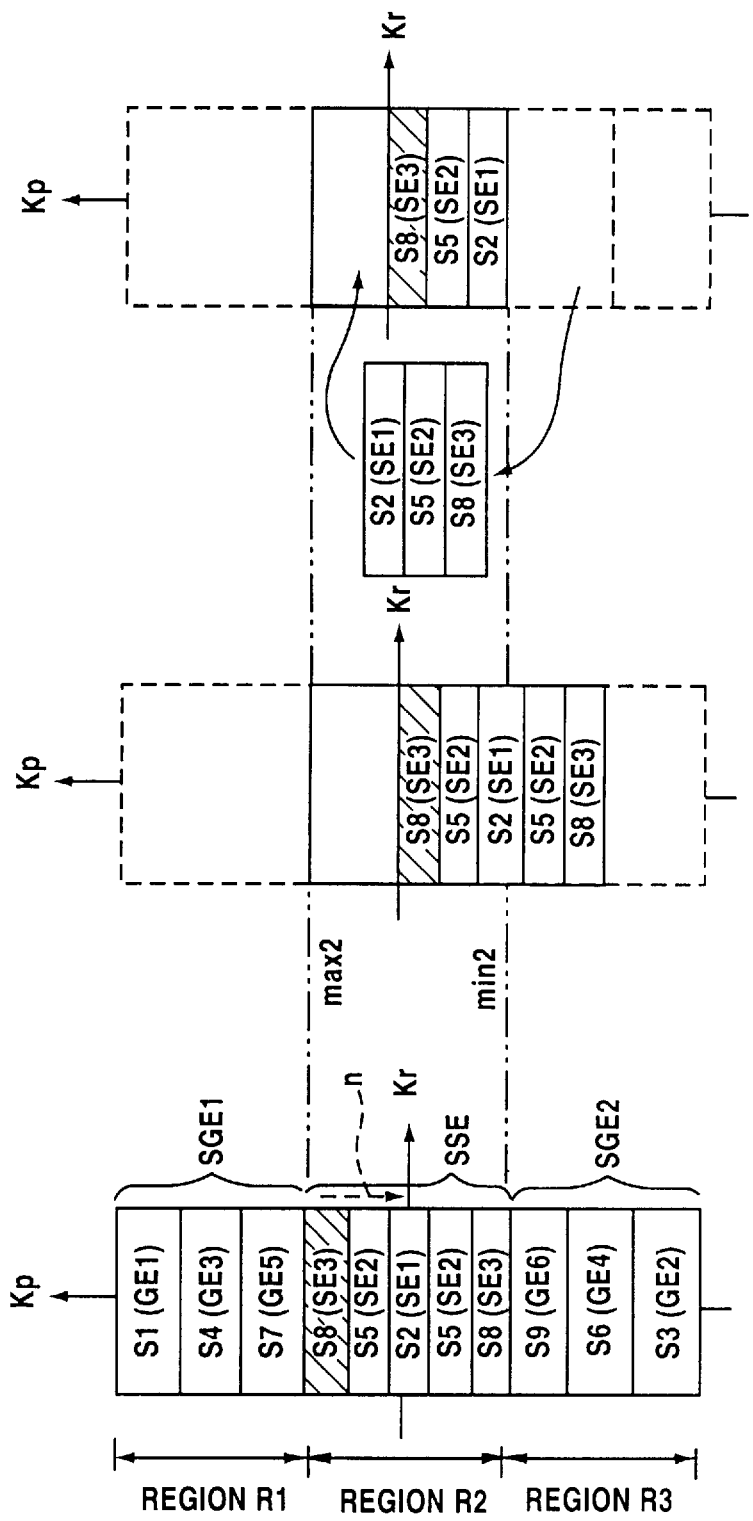

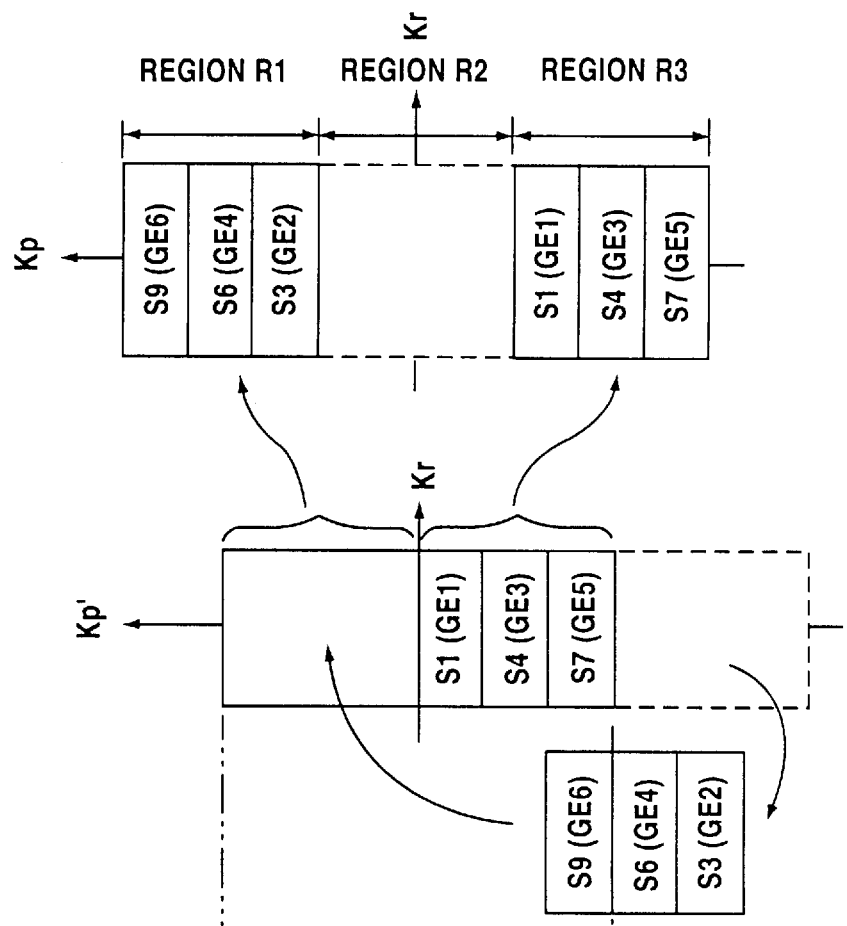

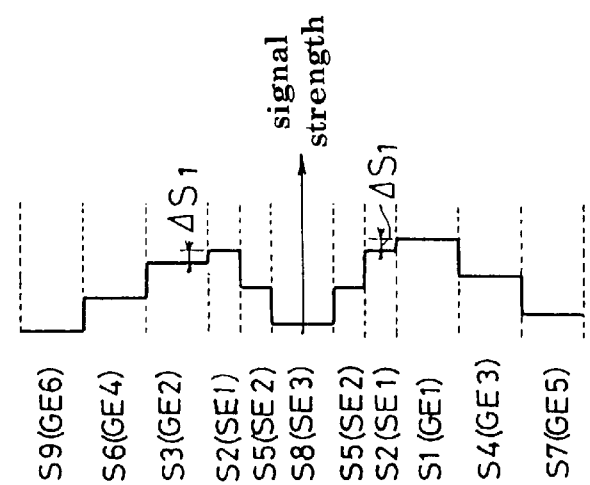
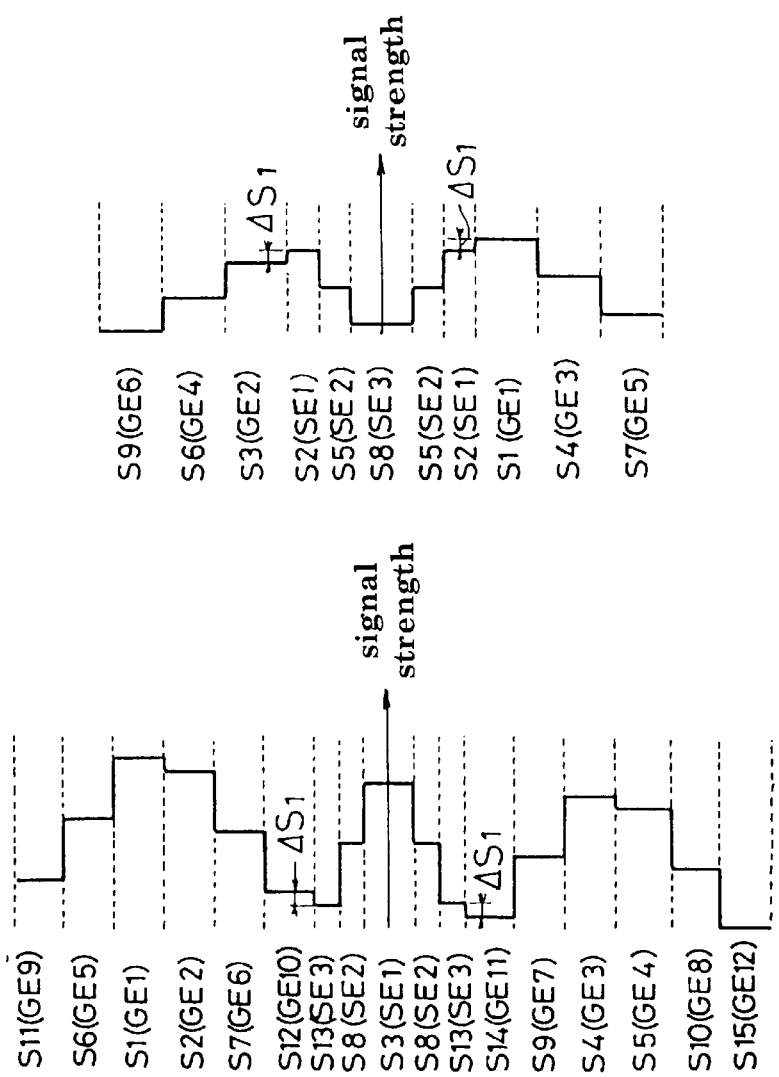
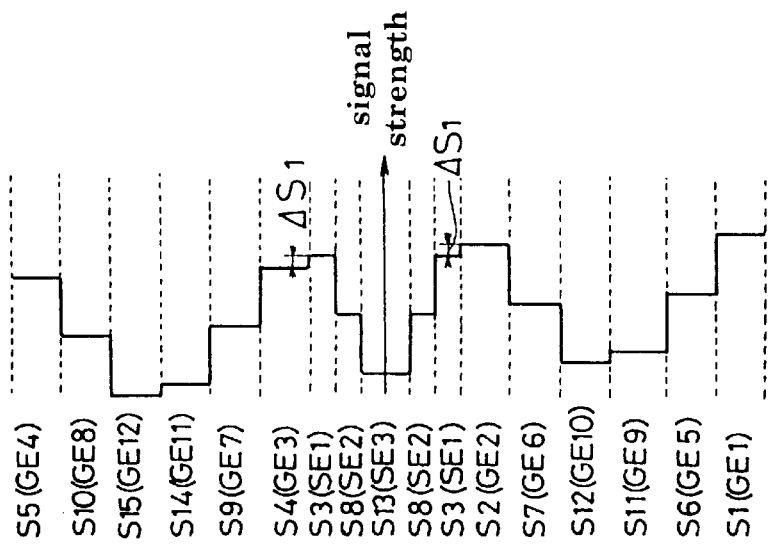

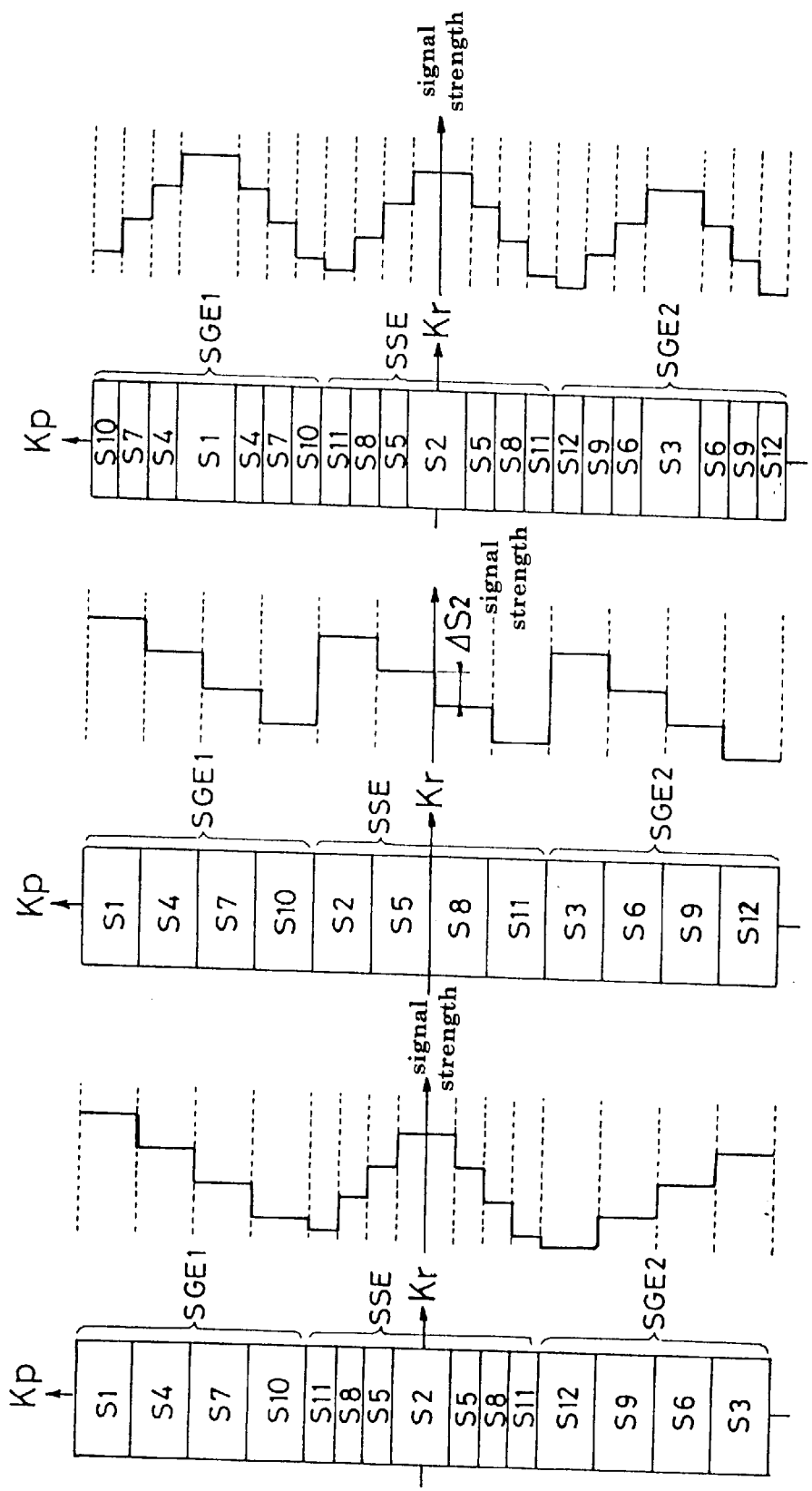

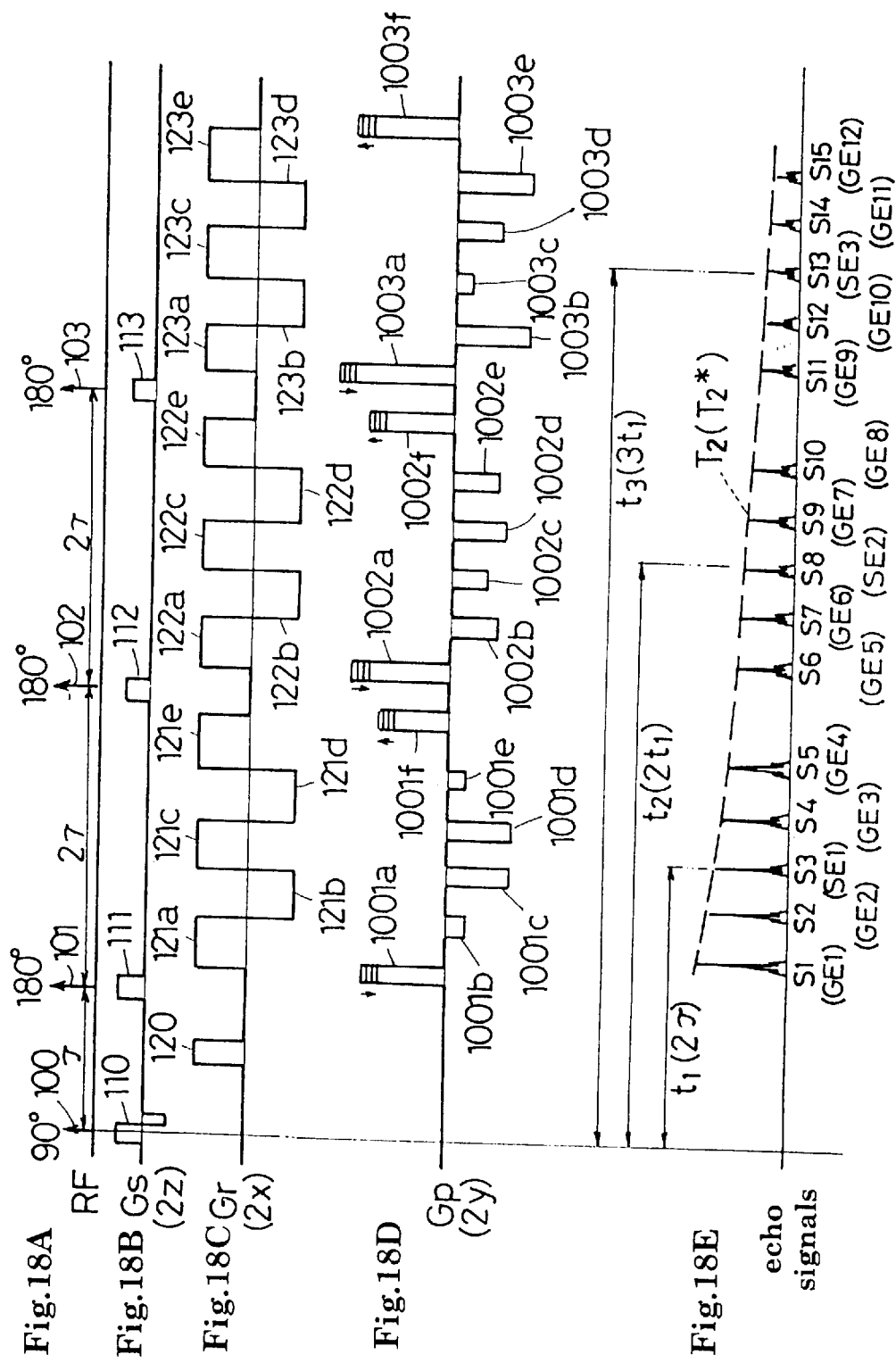

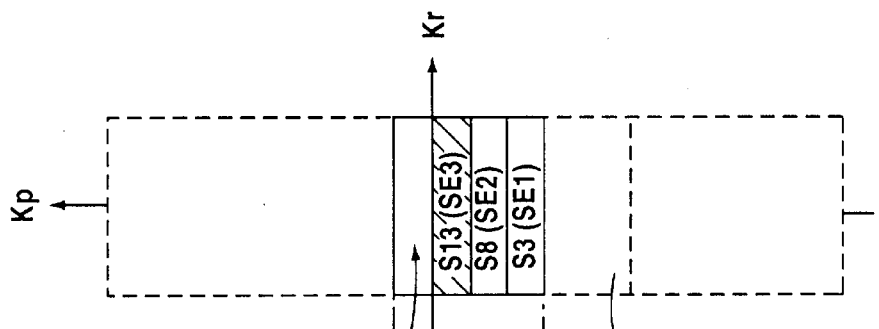
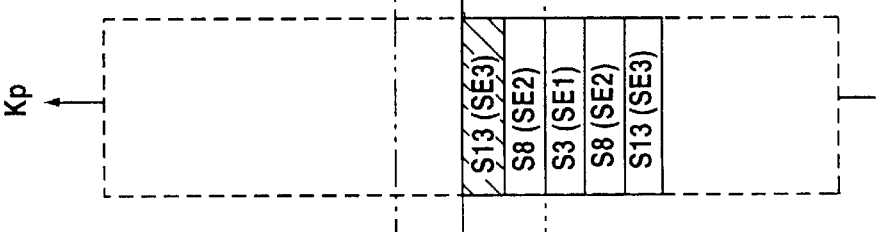
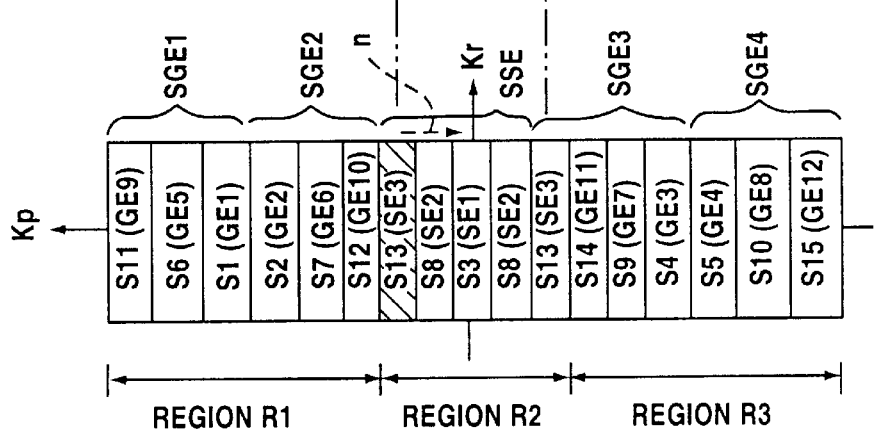

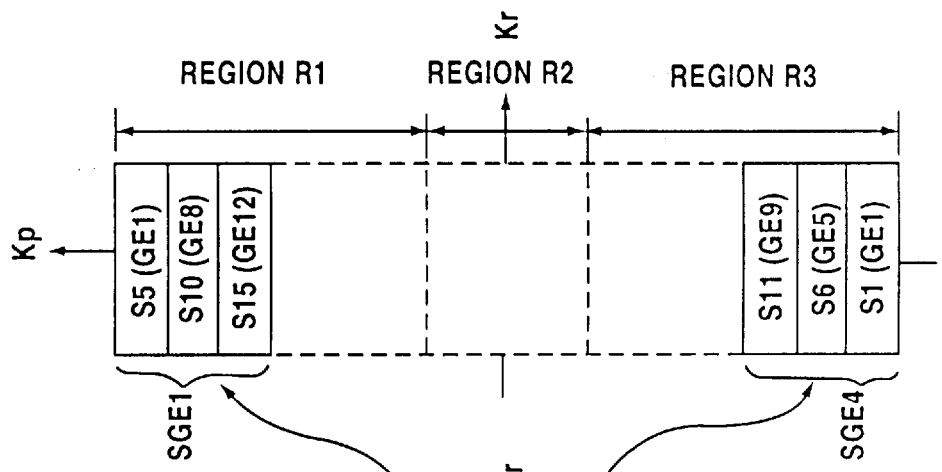
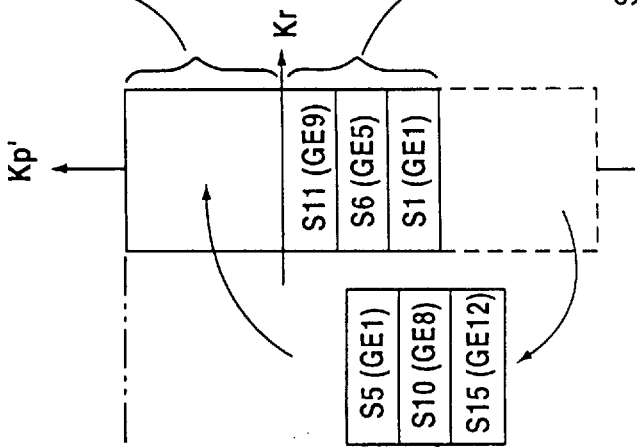
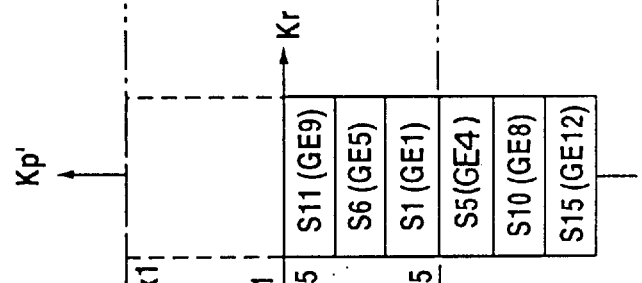
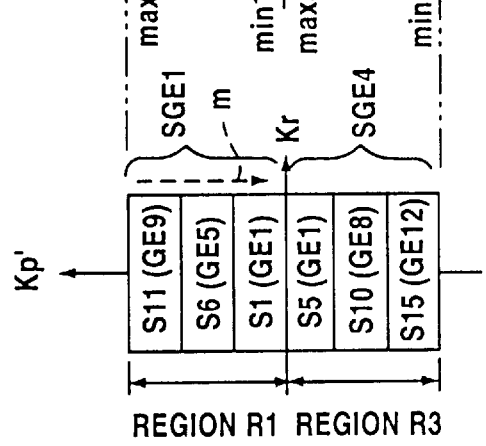

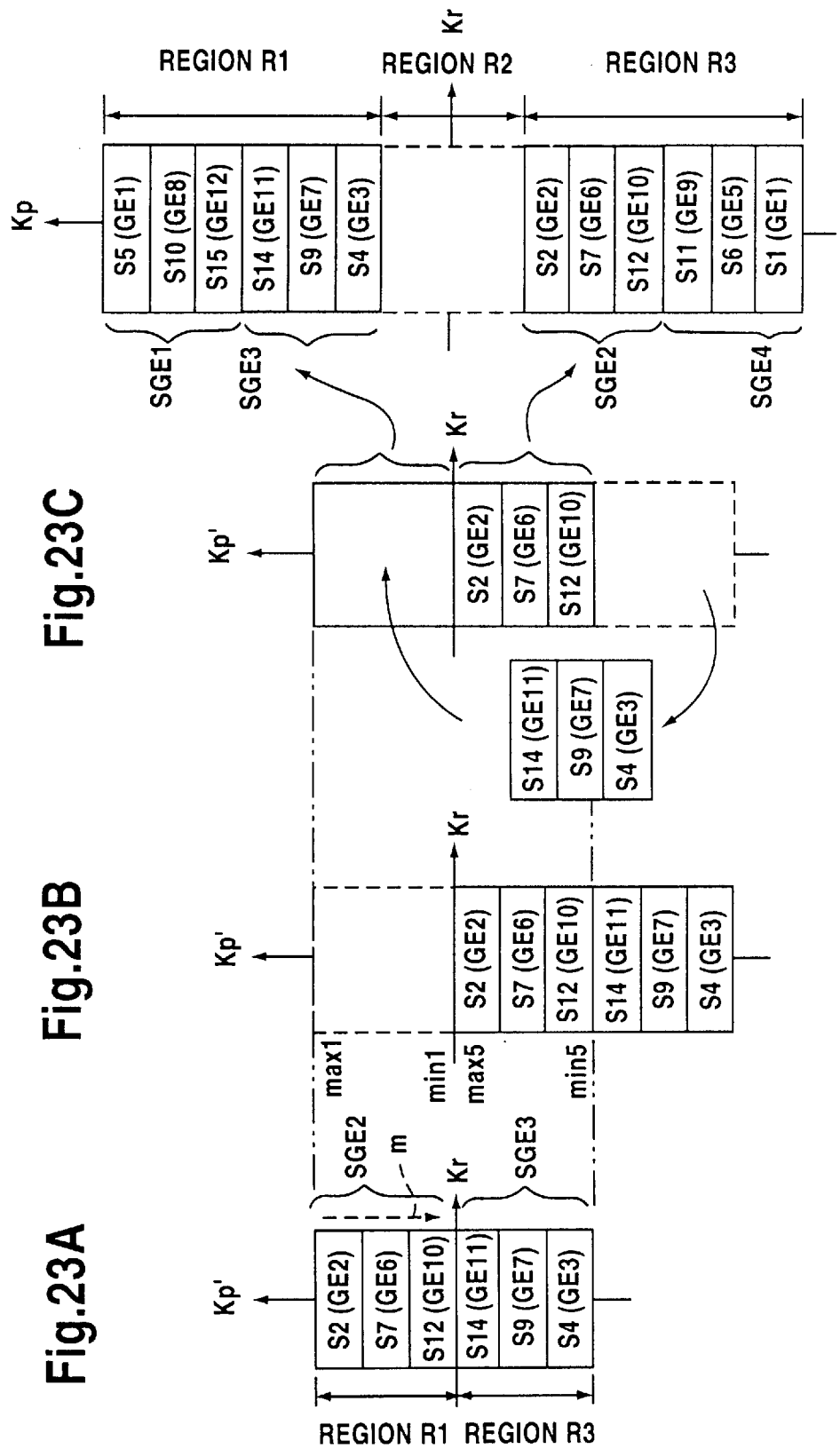

MR IMAGING APPARATUS

BACKGROUND OF THE INVENTION (1) Field of the Invention

This invention relates to MR imaging apparatus using NMR (nuclear magnetic resonance), and more particularly to high-speed imaging based on GRASE (gradient and spin echo) technique.

(2) Description of the Related Art

Various MR imaging apparatus capable of high-speed imaging have been conceived heretofore. For example, an MR imaging apparatus is known which effects a pulse sequence for high-speed imaging called GRASE technique (U.S. Pat. No. 5,270,654, and K. Oshio and D. A. Feiberg "GRASE (Gradient and Spin Echo) Imaging: A Novel Fast MRI Technique", Magnetic Resonance in Medicine 20, 344–349, 1991). The pulse sequence based on the GRASE technique is one combining the EPI (Echo Planar Imaging) technique, a type of high-speed imaging technique which generates gradient echo signals by switching the polarity of a gradient magnetic field, and the RARE (Rapid Acquisition with Relaxation Enhancement) which generates spin echo signals by using an excitation RF (Radio Frequency) pulse and refocus RF pulses.

The pulse sequence based on the GRASE technique in conventional practice will be described with reference to FIGS. 1A through 1E and 2A through 2C.

In this sequence, as shown in FIG. 1A, one excitation RF pulse 100 (also called 90° pulse since it rotates the spin phase of protons 90°) is applied, which is followed by a plurality of (three in this example) refocus RF pulses 101–103 (also called 180° pulses since they rotate the spin phase of protons 180° ). Simultaneously with these RF pulses, as shown in FIG. 1B, pulses 110–113 are applied to form slice-selecting gradient fields Gs. Then, as shown in FIG. 1C, a pulse 120 is applied to form a dephasing gradient field Gr for disarraying the protons, which is followed by pulses 121–123 applied between the above RF pulses to form reading and frequency-encoding gradient fields Gr.

Further, as shown in FIG. 1C, each of these Gr pulses 121–123 is switched a plurality of times (three times in this example) between one 180° pulse and the next 180° pulse (101 and 102, 102 and 103, or after 103). This generates, as shown in FIG. 1E, spin echo signals S2(SE1), S5(SE2) and S8(SE3) at points of time corresponding to an interval between 90° pulse 100 and 180° pulse 101 multiplied by even numbers, as well as gradient echo signals S1(GE1), S3(GE2), S4(GE3), S6(GE4), S7(GE5) and S9(GE6).

As shown in FIG. 1D, pulses of phase-encoding gradient fields Gp are applied immediately before generation of the nine echo signals S1–S9. These Gp pulses are applied in amounts corresponding to phase encode amounts for causing data acquired from the echo signals S1–S9 to be arranged in a k-space (also called a raw data space) as shown in FIG. 2A.

Specifically, the data acquired from spin echo signals SE1–SE3 are arranged in a middle region (low frequency region) R2 of the k-space. The data acquired from gradient echo signals GE1, GE3 and GE5, and those acquired from gradient echo signals GE2, GE4 and GE6, are arranged in peripheral regions (high frequency regions) R1 and R3 of the k-space, respectively. In each of the regions R1, R2 and R3, the data are arranged from top to bottom in the order of echo signal generation, i.e. from the positive high frequency region through the low frequency region to the negative high frequency region. The pulses of phase-encoding gradient fields Gp corresponding to the respective echo signals are applied in the amounts to realize the above arrangement.

To provide such phase encode amounts, as shown in FIGS. 1D and 2B, the pulse applied in the greatest amount is pulse 131a of phase encoding gradient field Gp which is applied immediately after the first 180° pulse 101 and immediately before the first gradient echo signal S1(GE1). As a result, the data acquired from the gradient echo signal S1(GE1) is placed in the uppermost position (positive region) in the k-space. The pulses 131b and 131c of phase-encoding gradient fields Gp immediately preceding the echo signals S2(SE1) and S3(GE2), respectively, have an opposite polarity to the gradient field pulse 131a. The pulses 131b and 131c have the same amplitude which is smaller in absolute value than that of the gradient field pulse 131a. Consequently, as shown in FIG. 2A, the data acquired from echo signals S2 and S3 are equidistantly arranged in the k-space downward from the position of the data acquired from signal S1.

The phase-encoding gradient field pulse 131d applied subsequently serves the rewinding purpose, i.e. for zero resetting phase encode amounts added up prior to application of the next 180° pulse 102. The phase-encoding gradient field pulse 132a applied after the second 180° pulse 102 has a slightly smaller amplitude than the gradient field pulse 131a. Consequently, the echo signal S4(GE3) has a phase encode amount to be disposed in the k-space immediately below the data acquired from echo signal S1(GE1). The gradient field pulses 132b and 132c immediately preceding the echo signals S5 and S6, respectively, have the same amplitude and polarity as the above gradient field pulses 131b and 131c. Consequently, the data acquired from echo signals S5(SE2) and S6(GE4) are arranged in the k-space downward from the position of the data acquired from signal S4, at intervals corresponding to the intervals at which the data from echo signals S1, S2 and S3 are arranged. Thus, the data from echo signals S5 and S6 are arranged in the k-space immediately below the data from signals S2 and S3, respectively. Subsequently, a rewinding gradient field pulse 132d is applied.

The gradient field pulse 133a applied after the third 180° pulse 103 has a still slightly smaller amplitude than the gradient field pulse 132a. The gradient field pulses 133b and 133c have the same amplitude and polarity as the gradient field pulses 131b and 131c and gradient field pulses 132b and 132c. Consequently, the data acquired from echo signals S7(GE5), S8(SE3) and S9(GE6) are arranged in the k-space immediately below the data from echo signals S4, S5 and S6, respectively.

As described above, an integral of phase encode amounts is set so that data acquired from the spin echo signals free from phase errors due to non-uniformity of the static magnetic field and due to chemical shifts are arranged in the middle region R2 of the k-space, which region is a low frequency region having a substantial influence on the contrast of an image reconstructed by a Fourier transform of the k-space. This provides the advantage that a blur is unlikely to occur to the reconstructed image, which is one type of artifacts caused by discontinuous phase encode amounts in the k-space due to phase errors. Further, in the above sequence, the echo signals having the same place in the order of generation within the respective periods between the 180° pulses are grouped together (as SGE1, SSE and SGE2 in FIG. 2A). This arrangement eliminates the phase errors at the boundaries between the echo signals grouped together, though the phase errors remain at the boundaries between the echo signal groups, to diminish the chance of a blur occurring to the image.

In the conventional pulse sequence described above, however, a striking difference ΔS in signal strength occurs at the boundaries between the groups (between SGE1 and SSE and between SSE and SGE2) of data acquired from the grouped echo signals. That is, the echo signals S1–S9 have strengths as shown in FIG. 2C. This is due to the fact that, as shown in FIG. 1E, the echo signals S1–S9 gradually attenuate with time constant T2 and time constant T2* after the first 90° pulse 100. Time constant T2 represents a transverse relaxation time (also called spin-spin relaxation time) occurring with the spin echo signals. Time constant T2* represents a transverse relaxation time occurring with the gradient echo signals and involving a faster attenuation due to non-uniformity of the static magnetic field than time constant T2. Thus, echo signals S1–S9 have strengths diminishing in the order of generation thereof.

The data acquired from echo signals S1–S9 are arranged in the k-space as shown in FIG. 2A. As seen in the phase encoding direction Kp, i.e. vertical direction, of the k-space, the signal strength changes sharply at the boundary between the data acquired from echo signal S7(GE5) and the data acquired from echo signal S2(SE1) (i.e. the boundary between SGE1 and SSE) and the boundary between the data acquired from echo signal S8(SE3) and the data acquired from echo signal S3(GE2) (i.e. the boundary between SSE and SGE2). This results in a disadvantage that, when an image is reconstructed by a Fourier transform of the data arranged in the k-space as above, artifacts will blur the reconstructed image.

As noted above, the middle echo signal S5 (i.e. spin echo signal SE2) in the echo signals generated is placed in the middle of the middle region R2 of the k-space. This fixes the contrast of the reconstructed image, and does not allow adjustments to a desired contrast level.

SUMMARY OF THE INVENTION

This invention has been made having regard to the state noted above, and its object is to provide an MR imaging apparatus which enables contrast adjustments of a reconstructed image while suppressing image blurring artifacts.

The above object is fulfilled, according to this invention, by an MR imaging apparatus using nuclear magnetic resonance (NMR phenomenon), comprising:

(a) a main magnet for generating a uniform static magnetic field in an imaging space;

(b) a first, a second and a third gradient field coils for generating three types of gradient field pulses including slice-selecting gradient field pulses, reading gradient field pulses and phase-encoding gradient field pulses, with magnetic strengths varying in three orthogonal directions in the imaging space;

(c) a RF coil for emitting an excitation RF pulse and a plurality of refocus RF pulses to an object placed in the imaging space and detecting echo signals emerging from the object;

(d) a RF emitter connected to the RF coil for successively emitting the excitation RF pulse and the refocus RF pulses with predetermined timing through the RF coil;

(e) a slice-selecting gradient field pulse generator for generating the slice-selecting gradient field pulses through the first gradient field coil for selecting slice planes, in timed relationship with the excitation RF pulse and the refocus RF pulses;

(f) a reading gradient field pulse generator for generating, during each of pulse spaces between the refocus RF pulses, a plurality of gradient echo signals distributed across one of spin echo signals by switching polarity a plurality of times, and for generating the reading gradient field pulses through the second gradient field coil in timed relationship with the spin echo signals and the gradient echo signals;

(g) a phase-encoding gradient field pulse generator for generating the phase-encoding gradient field pulses through the third gradient field coil immediately before generation of the echo signals, to effect phase encoding of the echo signals, the phase-encoding gradient field pulse generator satisfying the following conditions A–F:

A. that the phase-encoding gradient field pulses have varied strengths to vary all of integrated phase encode amounts of the echo signals;

B. that the phase-encoding gradient field pulses have varied strengths to give approximate integrated phase encode amounts to each of a group of the spin echo signals and groups of the gradient echo signals having the same places in an order of generation thereof within the pulse spaces;

C. that the phase-encoding gradient field pulses have varied strengths to give greater absolute values to integrated phase encode amounts of the groups of the gradient echo signals than integrated phase encode amounts of the group of the spin echo signals;

D. that the phase-encoding gradient field pulses have varied strengths to give an integrated phase encode amount adjacent a middle position in the group of the spin echo signals (i.e. spin echo group) to a spin echo signal (i.e. reference spin echo signal) having a particular place in the order of generation within the spin echo group (i.e. order within the spin echo group);

E. that the phase-encoding gradient field pulses have varied strengths such that, where the reference spin echo signal is first or last in the order within the spin echo group, integrated phase encode amounts of the spin echo signals in the group of the spin echo signals have absolute values successively increasing or decreasing from the phase encode amount of the reference spin echo signal according to the order within the spin echo group; and F. that the phase-encoding gradient field pulses have varied strengths such that, where the reference spin echo signal is first or last in the order within the spin echo group, integrated phase encode amounts of the gradient echo signals in the groups of the gradient echo signals (i.e. gradient echo groups) have absolute values successively decreasing or increasing according to the order of generation in the group of the gradient echo signals (i.e. order within the gradient echo groups), a direction in which the absolute values of the integrated phase encode amounts of each of the gradient echo groups change is switched alternately with extension of a period of time from a gradient echo group having the shortest period of time with respect to points of time at which the spin echo signals are generated, and the absolute values are greater than the absolute values of the integrated phase encode amounts of a gradient echo group having a shorter period of time;

(h) a designating device for designating a value relating to the order within the spin echo group; and (i) a data processor for collecting data from the echo signals detected by the RF coil, and reconstructing a sectional image by arranging the data in a k-space according to the integrated phase encode amounts of the echo signals.

The main magnet forms a static magnetic field in an imaging space, and then the slice-selecting gradient field pulse generator applies slice-selecting gradient field pulses through the first gradient field coil to select a slice plane. Then, the RF emitter emits one excitation RF pulse and a plurality of refocus RF pulses successively. Spin echo signals free from phase errors due to non-uniformity of the static magnetic field formed by the main magnet or due to chemical shifts are generated during periods corresponding to a period between the excitation RF pulse and the first refocus RF pulse multiplied by even numbers. Further, during each of the periods between the refocus RF pulses, the reading gradient field pulse generator switches the polarity of reading gradient field pulses a plurality of times through the second gradient field coil, to generate a plurality of gradient echo signals distributed across one of the spin echo signals.

Thus, each period between the refocus RF pulses includes a plurality of gradient echo signals distributed across one spin echo signal. These echo signals have signal strengths decreasing successively in the order of generation and substantially with time constants of transverse relaxation time.

The echo signals generated successively are subjected to phase encoding by the phase-encoding gradient field pulse generator generating phase-encoding gradient field pulses through the third gradient field coil. The phase-encoding gradient field pulse generator satisfies all of the conditions set out below in phase-encoding the echo signals.

The phase-encoding gradient field pulses are emitted with varied strengths to the echo signals generated, to provide different integrated phase encode amounts (A). Consequently, data acquired from the echo signals are arranged in different positions in a phase encoding direction of a k-space.

The strengths of the phase-encoding gradient field pulses are varied to give approximate integrated phase encode amounts to each of groups of echo signals (consisting of a group of spin echo signals and groups of gradient echo signals) having the same places in an order of generation thereof within the pulse spaces (B). Consequently, the echo signals in the same group are arranged adjacent one another in the k-space.

The strengths of the phase-encoding gradient field pulses are varied to give greater absolute values to integrated phase encode amounts of the groups of gradient echo signals than integrated phase encode amounts of the group of spin echo signals (C). Consequently, the group of spin echo signals free from phase errors is arranged in a middle region of the k-space, while the groups of gradient echo signals are arranged in peripheral regions opposed to each other across the middle region.

The strengths of the phase-encoding gradient field pulses are varied to give an integrated phase encode amount adjacent a middle position in the group of spin echo signals (i.e. spin echo group) to a spin echo signal (i.e. reference spin echo signal) having a particular place in the order of generation within the spin echo group (i.e. order within the spin echo group) (D). Consequently, the data acquired from the reference spin echo signal is placed adjacent the middle of the middle region in the k-space which has a great influence on the contrast of an image.

The phase-encoding gradient field pulses are applied such that, where the reference spin echo signal is first (or last) in the order within the spin echo group, integrated phase encode amounts of the spin echo signals in the group of the spin echo signals have absolute values successively increasing (or decreasing) from the phase encode amount of the reference spin echo signal according to the order within the spin echo group (E).

By successively increasing (or decreasing) the absolute values of integrated phase encode amounts of the spin echo signals, except the reference spin echo signal, from the phase encode amount of the reference spin echo signal (adjacent the middle) in the spin echo group according to the order within the spin echo group, the spin echo signals are arranged in ascending (or descending) order toward the opposite ends of the spin echo group in the k-space (i.e. vertically of the phase encode amounts in the k-space) according to the order within the spin echo group. Thus, the spin echo group in the k-space (i.e. the middle region of the k-space) presents an arched (or recessed) signal strength profile since the signal strength attenuates in the order of echo signal generation. That is, the middle portion of the spin echo group has a maximum (or minimum) signal strength which decreases (or increases) toward peripheries of the spin echo group.

The strengths of the phase-encoding gradient field pulses are varied such that, where the reference spin echo signal is first (or last) in the order within the spin echo group, integrated phase encode amounts of the gradient echo signals in the groups of the gradient echo signals (i.e. gradient echo groups) have absolute values successively decreasing (or increasing) according to the order of generation in the group of the gradient echo signals (i.e. order within the gradient echo groups), a direction in which the absolute values of the integrated phase encode amounts of each of the gradient echo groups change is switched alternately with extension of a period of time from a gradient echo group having the shortest period of time with respect to points of time at which the spin echo signals are generated, and the absolute values are greater than the absolute values of the integrated phase encode amounts of a gradient echo group having a shorter period of time (F).

By successively decreasing (or increasing) the absolute values of integrated phase encode amounts of the gradient echo signals in each gradient echo group according to the order within the gradient echo group, the gradient echo signals in each group are arranged from the peripheral position toward the middle region of the k-space according to the order of generation (or the opposite order thereto). Thus, each gradient echo group in the k-space (i.e. upper peripheral region or lower peripheral region) presents a signal strength profile diminishing (or enlarging) from the peripheral position toward the middle region of the k-space since the signal strength attenuates in the order of signal generation.

Further, by alternately switching the direction in which the absolute values of the integrated phase encode amounts of each of the gradient echo groups change, with extension of a period of time from a gradient echo group having the shortest period of time with respect to points of time at which the spin echo signals are generated, a gradient echo group disposed adjacent and peripherally of the gradient echo group having a diminishing (or enlarging) signal strength presents, conversely, a signal strength profile enlarging (or diminishing) from the peripheral position toward the middle region of the k-space.

By varying the strengths of the phase-encoding gradient field pulses such that the absolute values are greater, with extension of a period of time from a gradient echo group having the shortest period of time with respect to points of time at which the spin echo signals are generated, than the absolute values of the integrated phase encode amounts of a gradient echo group having a shorter period of time, the gradient echo group having the longer period of time is arranged the closer to a peripheral position of the k-space.

As a result, a reduced difference in signal strength occurs at boundaries between the spin echo group or middle region (with the arched (or recessed) signal strength and adjacent gradient echo groups or peripheral regions (with the signal strength decreasing (or increasing) toward the middle position) in the k-space. This suppresses image blurring artifacts due to large differences in signal strength. Similarly, a reduced difference in signal strength occurs at boundaries between the gradient echo groups (with the signal strength decreasing (or increasing) toward the middle position) at the opposite sides of the spin echo group and the gradient echo groups arranged adjacent and peripherally of the above gradient echo groups (with the signal strength increasing (or decreasing) toward the middle position). Further, the spin echo group has an arched (or recessed) signal strength profile, while the peripheral gradient echo groups have signal strength profiles diminishing (or enlarging) toward the middle position. Thus, the "waves" of the signal strength profiles are decreased, thereby suppressing image blurring artifacts due to the "waves" at the same time.

In the spin echo group in the k-space, the data are arranged in the order within the spin echo group which is ascending (or descending) order toward the opposite peripheral ends from the reference spin echo signal placed in the middle. In the gradient echo groups at the opposite sides, the data are arranged in the order within the gradient echo groups which is ascending (or descending) order toward the middle position. Thus, the echo signals arranged at the peripheries of two adjacent groups are close to each other in the order of generation (that is, adjacent each other in the order of generation, e.g. echo signal S7 and echo signal S8 are arranged adjacent each other). In the gradient echo groups arranged adjacent and peripherally of the above gradient echo groups, the order is opposite to the order in the gradient echo groups arranged closer to the middle position, i.e. the order within the gradient groups is in descending (or ascending) order. Thus, as in the above case, the echo signals arranged at the peripheries of two adjacent groups are close to each other in the order of generation. From this point also, it is seen that a reduced difference in signal strength occurs at each of the boundaries between the spin echo group and the gradient echo groups arranged peripherally thereof and between these gradient echo groups and the gradient echo groups arranged peripherally thereof, thereby suppressing image blurring artifacts.

When the operator designates through the designating device a value relating to the order within the spin echo group, e.g. a place of a spin echo signal in the order within the spin echo group, or an echo time which is the time at which the spin echo signal is generated, the reference spin echo signal to be placed in the middle of the spin echo group in the k-space is determined to be the first or last signal in the order based on the value designated. A value relating to the order within the spin echo group such as a place in the order of spin echo generation or an echo time relates to a period of time elapsed from emission of an excitation RF pulse, i.e. transverse relaxation time. By designating the first or last in the order within the spin echo group, a spin echo signal of shorter or longer echo time may be placed in the middle of the middle region in the k-space. The image reconstructed from the k-space by the data processor may be a proton density weighted image excluding T2-relaxation information or a heavy T2-weighted image with whitened water components. That is, contrast may be adjusted while suppressing image blurring artifacts.

Since the difference in signal strength is minimized and smoothed at the boundaries between the middle region and the upper and lower peripheral regions of the k-space, image blurring artifacts due to large differences in signal strength are suppressed from appearing in the reconstructed image. The image blurring artifacts are further suppressed since the waves of the signal strength profile are diminished. By designating the first or last one through the designating device as a value relating to the order within the spin echo group, a spin echo signal of shorter or longer echo time may be placed in the middle of the middle region in the k-space. Thus, the image reconstructed may be a proton density weighted image or a heavy T2-weighted image. That is, contrast may be adjusted while suppressing image blurring artifacts.

It is preferred, in this invention, that designating device is operable to designate values relating to first to last in the order within the spin echo group, and the phase-encoding gradient field pulse generator is operable to apply phase-encoding gradient field pulses to effect phase encoding for each group in a range from the smallest to the greatest integrated phase encode amounts (from a minimum integrated amount to a maximum integrated amount), the phase-encoding gradient field pulse generator being operable to vary strengths of the phase-encoding gradient field pulses to satisfy the following conditions G and H besides the conditions A–F when the value designated through the designating device relates to an intermediate place in the order:

G. when, in the spin echo group, the integrated phase encode amounts of the spin echo signals are greater than the maximum integrated amount of the spin echo group by a predetermined amount, the smallest of the integrated phase encode amounts is made a new integrated phase encode amount corresponding to the minimum integrated amount of the spin echo group, with increasing integrated phase encode amounts made new integrated phase encode amounts successively increasing from the minimum integrated amount, and the integrated phase encode amounts of a first gradient echo group and a second gradient echo group forming a pair of gradient echo groups having equal periods of time with respect to the points of time at which the spin echo signals are generated are increased by twice the predetermined amount, when the integrated phase encode amounts of the gradient echo signals in the first gradient echo group are greater than the maximum integrated amount of the first gradient echo group, the smallest of the integrated phase encode amounts is made a new integrated phase encode amount corresponding to the minimum integrated amount of the second gradient echo group, with increasing integrated phase encode amounts made new integrated phase encode amounts successively increasing from the minimum integrated amount, and when the integrated phase encode amounts of the gradient echo signals in the second gradient echo group are greater than the maximum integrated amount of the second gradient echo group, the smallest of the integrated phase encode amounts is made a new integrated phase encode amount corresponding to the minimum integrated amount of the first gradient echo group, with increasing integrated phase encode amounts made new integrated phase encode amounts successively increasing from the minimum integrated amount; and H. when, in the spin echo group, the integrated phase encode amounts of the spin echo signals are smaller than the minimum integrated amount of the spin echo group by a predetermined amount, the greatest of the integrated phase encode amounts is made a new integrated phase encode amount corresponding to the maximum integrated amount of the spin echo group, with decreasing integrated phase encode amounts made new integrated phase encode amounts successively decreasing from the maximum integrated amount, and the integrated phase encode amounts of the first gradient echo group and the second gradient echo group forming a pair of gradient echo groups having equal periods of time with respect to the points of time at which the spin echo signals are generated are decreased by twice the predetermined amount, when the integrated phase encode amounts of the gradient echo signals in the first gradient echo group are smaller than the minimum integrated amount of the first gradient echo group, the greatest of the integrated phase encode amounts is made a new integrated phase encode amount corresponding to the maximum integrated amount of the second gradient echo group, with decreasing integrated phase encode amounts made new integrated phase encode amounts successively decreasing from the maximum integrated amount, and when the integrated phase encode amounts of the gradient echo signals in the second gradient echo group are smaller than the minimum integrated amount of the second gradient echo group, the greatest of the integrated phase encode amounts is made a new integrated phase encode amount corresponding to the maximum integrated amount of the first gradient echo group, with decreasing integrated phase encode amounts made new integrated phase encode amounts successively decreasing from the maximum integrated amount.

The designating device is operable to designate values relating to first to last in the order within the spin echo group. That is, it is possible to designate intermediate values as well as the first and last in the order within the spin echo group.

The phase-encoding gradient field pulse generator is operable to apply phase-encoding gradient field pulses to effect phase encoding for each group in a range from a minimum integrated amount to a maximum integrated amount. The phase-encoding gradient field pulse generator satisfies the foregoing conditions A–F and varies strengths of the phase-encoding gradient field pulses as set out below when the value designated through the designating device relates to an intermediate place in the order within the spin echo group.

That is, (G) when, in the spin echo group, the integrated phase encode amounts of the spin echo signals are greater than the maximum integrated amount of the spin echo group by a predetermined amount, the smallest of the integrated phase encode amounts is made a new integrated phase encode amount corresponding to the minimum integrated amount of the spin echo group, with increasing integrated phase encode amounts made new integrated phase encode amounts successively increasing from the minimum integrated amount.

Consequently, the data of the spin echo signal, which was to be subjected to phase encoding greater by a predetermined amount than the maximum integrated amount based on the value designated through the designated device, i.e. the spin echo signal placed in the upper position in the spin echo group arranged in the k-space to satisfy the foregoing conditions A–F, is disposed in an opposite position (lower position) in the group across the reference spin echo signal instead of application of the integrated phase encode amount. The data of the spin echo signals which were to be subjected to phase encoding greater than the maximum integrated amount are arranged, as they become remote from the maximum integrated amount, from the lower position toward the reference spin echo signal (i.e. the middle of the spin echo group) in the k-space. In other words, the data of the echo signals in the spin echo group are once shifted upward so that the data of the reference spin echo signal designated is placed in the middle of the spin echo group while satisfying the foregoing conditions A–F. The data protruding from the upper end of the group are successively fed upward at the opposite end of the group. In this way, the data are shifted in circulation within the spin echo group.

Further, the integrated phase encode amounts of a first gradient echo group and a second gradient echo group forming a pair of gradient echo groups having equal periods of time with respect to the points of time at which the spin echo signals are generated are increased by twice the predetermined amount. That is, the first gradient echo group and second gradient echo group arranged at opposite sides of the spin echo group are regarded as one unit. The integrated phase encode amounts of the pair of gradient echo groups having twice the number of echo signals in the spin echo group are increased by twice the predetermined amount for the spin echo group. Consequently, the shift amount of the phase encode amounts for the pair of gradient echo groups corresponds to the shift amount of the phase encode amounts for the spin echo group.

When the integrated phase encode amounts of the gradient echo signals in the first gradient echo group are greater than the maximum integrated amount of the first gradient echo group, the smallest of the integrated phase encode amounts is made a new integrated phase encode amount corresponding to the minimum integrated amount of the second gradient echo group, with increasing integrated phase encode amounts made new integrated phase encode amounts successively increasing from the minimum integrated amount. When the integrated phase encode amounts of the gradient echo signals in the second gradient echo group are greater than the maximum integrated amount of the second gradient echo group, the smallest of the integrated phase encode amounts is made a new integrated phase encode amount corresponding to the minimum integrated amount of the first gradient echo group, with increasing integrated phase encode amounts made new integrated phase encode amounts successively increasing from the minimum integrated amount.

Consequently, the data of the gradient echo signal, which was to be subjected to phase encoding greater than the maximum integrated amount of the first gradient echo group in the k-space, i.e. the gradient echo signal placed in the upper position in the first gradient echo group arranged in the k-space to satisfy the foregoing conditions A–F, is disposed in the lower position in the second gradient echo group across the reference spin echo signal instead of application of the integrated phase encode amount.

Further, the data acquired from the gradient echo signals which were to be subjected to phase encoding greater than the maximum integrated amount are arranged, as they become remote from the maximum integrated amount of the first gradient echo group, in the second gradient echo group toward the middle of the k-space. On the other hand, the data of the gradient echo signal, which was to be subjected to phase encoding greater than the maximum integrated amount of the second gradient echo group in the k-space, i.e.

the gradient echo signal placed in the upper position in the second gradient echo group arranged in the k-space to satisfy the foregoing conditions A–F, is transferred to the lower position in the first gradient echo group opposite across the reference spin echo signal instead of application of the integrated phase encode amount. The data of the gradient echo signals which were to be subjected to phase encoding greater than the maximum integrated amount are arranged, as they become remote from the maximum integrated amount of the second gradient group, in the first gradient echo group toward a periphery of the k-space.

In other words, the pair of gradient echo groups are once shifted by twice the shift amount of the spin echo group in the same direction while satisfying all of the foregoing conditions A–F. The data of the gradient echo signals protruding from the upper end of each gradient echo group are successively fed upward at the opposite end of the other gradient echo group. In this way, the data are shifted in circulation within the pair of gradient echo groups.

Further, (H), when, in the spin echo group, the integrated phase encode amounts of the spin echo signals are smaller than the minimum integrated amount of the spin echo group by a predetermined amount, the greatest of the integrated phase encode amounts is made a new integrated phase encode amount corresponding to the maximum integrated amount of the spin echo group, with decreasing integrated phase encode amounts made new integrated phase encode amounts successively decreasing from the maximum integrated amount, and the integrated phase encode amounts of the pair of gradient echo groups (first gradient echo group and second gradient echo group) having equal periods of time with respect to the points of time at which the spin echo signals are generated are decreased by twice the predetermined amount, when the integrated phase encode amounts of the gradient echo signals in the first gradient echo group are smaller than the minimum integrated amount of the first gradient echo group, the greatest of the integrated phase encode amounts is made a new integrated phase encode amount corresponding to the maximum integrated amount of the second gradient echo group, with decreasing integrated phase encode amounts made new integrated phase encode amounts successively decreasing from the maximum integrated amount, and when the integrated phase encode amounts of the gradient echo signals in the second gradient echo group are smaller than the minimum integrated amount of the second gradient echo group, the greatest of the integrated phase encode amounts is made a new integrated phase encode amount corresponding to the maximum integrated amount of the first gradient echo group, with decreasing integrated phase encode amounts made new integrated phase encode amounts successively decreasing from the maximum integrated amount.

Consequently, as in the above case, the data of the spin echo signal, which was to be subjected to phase encoding smaller by a predetermined amount than the minimum integrated amount, i.e. the spin echo signal placed in the lower position in the spin echo group arranged in the k-space to satisfy all of the foregoing conditions A–F, is disposed in an opposite position (upper position) in the group across the reference spin echo signal without changing the order of arrangement in the spin echo group. Further, the data of the gradient echo signal, which was to be subjected to phase encoding smaller than the minimum integrated amount of the first gradient echo group, i.e. the gradient echo signal placed in the lower position in the first gradient echo group arranged in the k-space to satisfy the foregoing conditions, is disposed in the upper position in the second gradient echo group. The data of the gradient echo signal, which was to be placed in the lower position in the second gradient echo group, is disposed in the upper position in the first gradient echo group.

As described above, the data acquired from the spin echo signals, which were to be subjected to phase encoding protruding from the integrated phase encode amounts in an applicable range, are shifted in circulation, as they protrude from a peripheral position of the spin echo group in the k-space, to the opposite peripheral position of the group. As for the gradient echo groups, a pair of gradient echo groups equal in period of time are regarded as one unit, and the data acquired from the gradient echo signals, which were to be subjected to phase encoding protruding from the integrated phase encode amounts in an applicable range, are shifted in circulation, as they protrude from a peripheral position of one gradient echo group in the k-space, to the opposite peripheral position of the other gradient echo group.

Thus, where the spin echo signals in the spin echo group are shifted in circulation only within that group, and the gradient echo signals in a pair of gradient echo groups are shifted in circulation only within that pair of groups, to be arranged in the k-space, the orders of arrangement in the spin echo group and in each gradient echo group are maintained while satisfying all of the foregoing conditions A–F. In the spin echo group, the order within the spin echo group remains to be ascending (or descending) order with a selected reference spin echo signal acting as a key and after the circulation within the spin echo group. In the gradient echo groups, the order within each gradient echo group remains to be ascending (or descending) order with reference to the gradient echo in the upper position in the first gradient echo group of the time and the gradient echo in the lower position in the second gradient echo group of the time and after the circulation within the pair of gradient echo groups. Thus, as when the foregoing conditions are all satisfied, echo signals close to one another in the order of generation are arranged at peripheries of adjacent groups, i.e. the peripheries of the spin echo group and the peripheries of the two gradient echo groups. Consequently, the difference in signal strength remains minimal at the boundaries of the groups, to suppress image blurring artifacts due to large differences in signal strength. Further, by designating an intermediate place in the order within the spin echo group through the designating device, a spin echo signal may be selected from those of short echo time to long echo time to be placed in the middle of the middle region of the k-space. This enables a reconstructed image obtained through a Fourier transform of the k-space by the data processor to be a proton density weighted image or a heavy T2-weighted image, or a varied, intermediate T2-weighted image based on echo times. That is, contrast may be adjusted with increased flexibility while suppressing image blurring artifacts.

As noted above, by designating an intermediate place in the order within the spin echo group through the designating device, a spin echo signal may be selected from those of short echo time to long echo time to be placed in the middle of the middle region of the k-space. This enables a reconstructed image to be a proton density weighted image or a heavy T2-weighted image, or a varied, intermediate T2-weighted image based on echo times. That is, contrast may be adjusted with increased flexibility while suppressing image blurring artifacts.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIGS. 1A through 1E are a time chart showing a pulse sequence according to the prior art;

FIGS. 4A through 4E are a time chart showing a pulse sequence in a first embodiment of this invention;

FIGS. 5A and 5B are a time chart showing another pulse sequence in the first embodiment;

FIGS. 9A through 9C are explanatory views showing a circulating shift arrangement of echo signals in the k-space;

FIGS. 10A through 10D are explanatory views showing the circulating shift arrangement of echo signals in the k-space;

FIGS. 13A through 13C are explanatory views showing a circulating shift arrangement of echo signals in the k-space;

FIGS. 14A through 14D are explanatory views showing a circulating shift arrangement of echo signals in the k-space;

FIG. 16 is a schematic view showing signal strengths in the case of "last" in the order within the spin echo group;

FIGS. 17A through 17C are explanatory views showing an additional advantage of this invention;

FIGS. 18A through 18E are a time chart showing a pulse sequence in a second embodiment of this invention;

FIG. 20 is a schematic view showing signal strengths in the case of "first" in the order within the spin echo group;

FIGS. 21A through 21C are explanatory views showing a circulating shift arrangement of echo signals in the k-space;

FIGS. 22A through 22D are explanatory views showing the circulating shift arrangement of echo signals in the k-space;

FIGS. 23A through 23D are explanatory views showing the circulating shift arrangement of echo signals in the k-space;

FIG. 25 is a schematic view showing signal strengths in the case of "last" in the order within the spin echo group.

DESCRIPTION OF THE PREFERRED EMBODIMENT

Preferred embodiments of this invention will be described in detail hereinafter with reference to the drawings.

First Embodiment

Figures 2A, 2B, 2C:
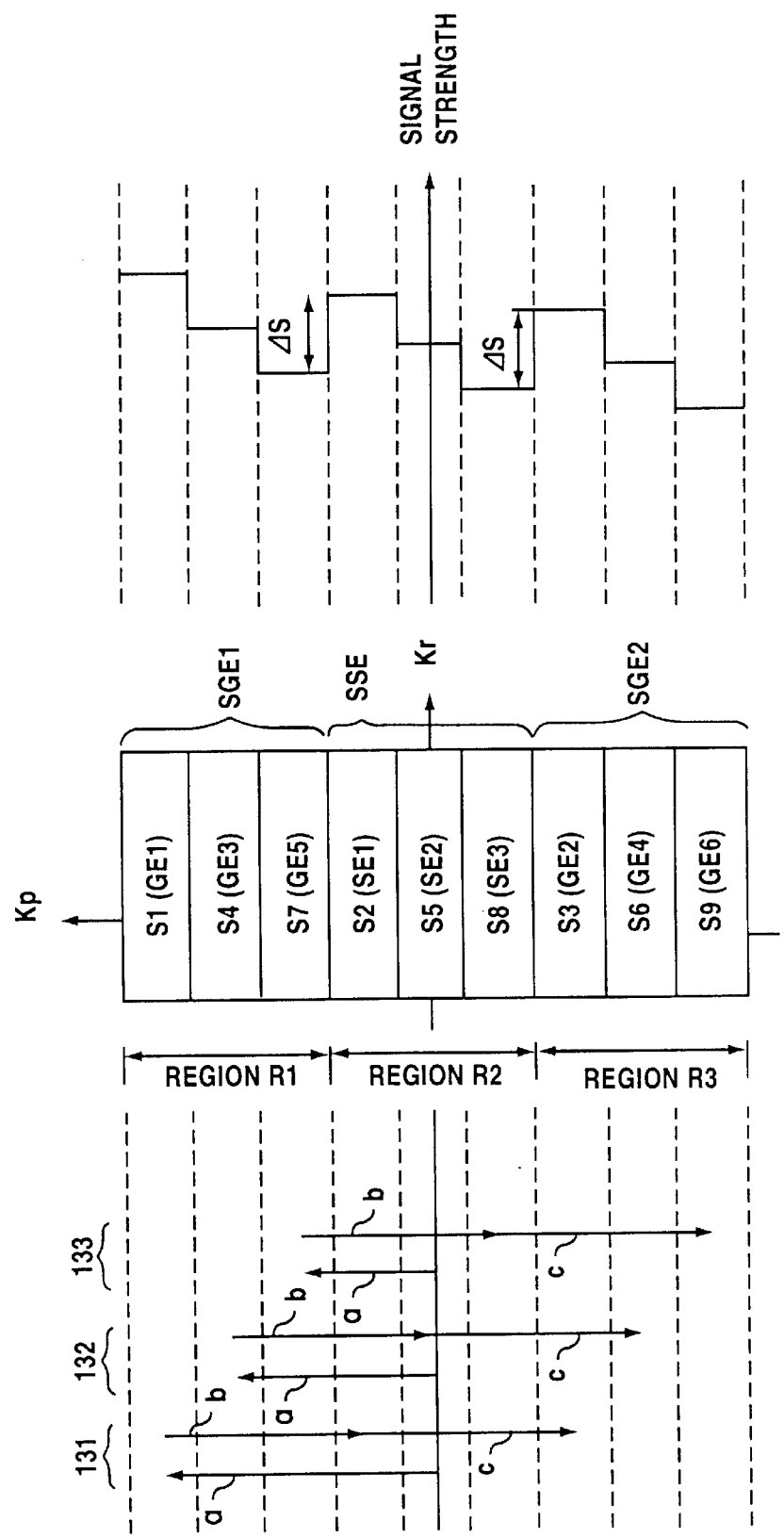
FIGS. 2A through 2C are a schematic view showing a k-space and signal strengths according to the prior art.
Figure 3:
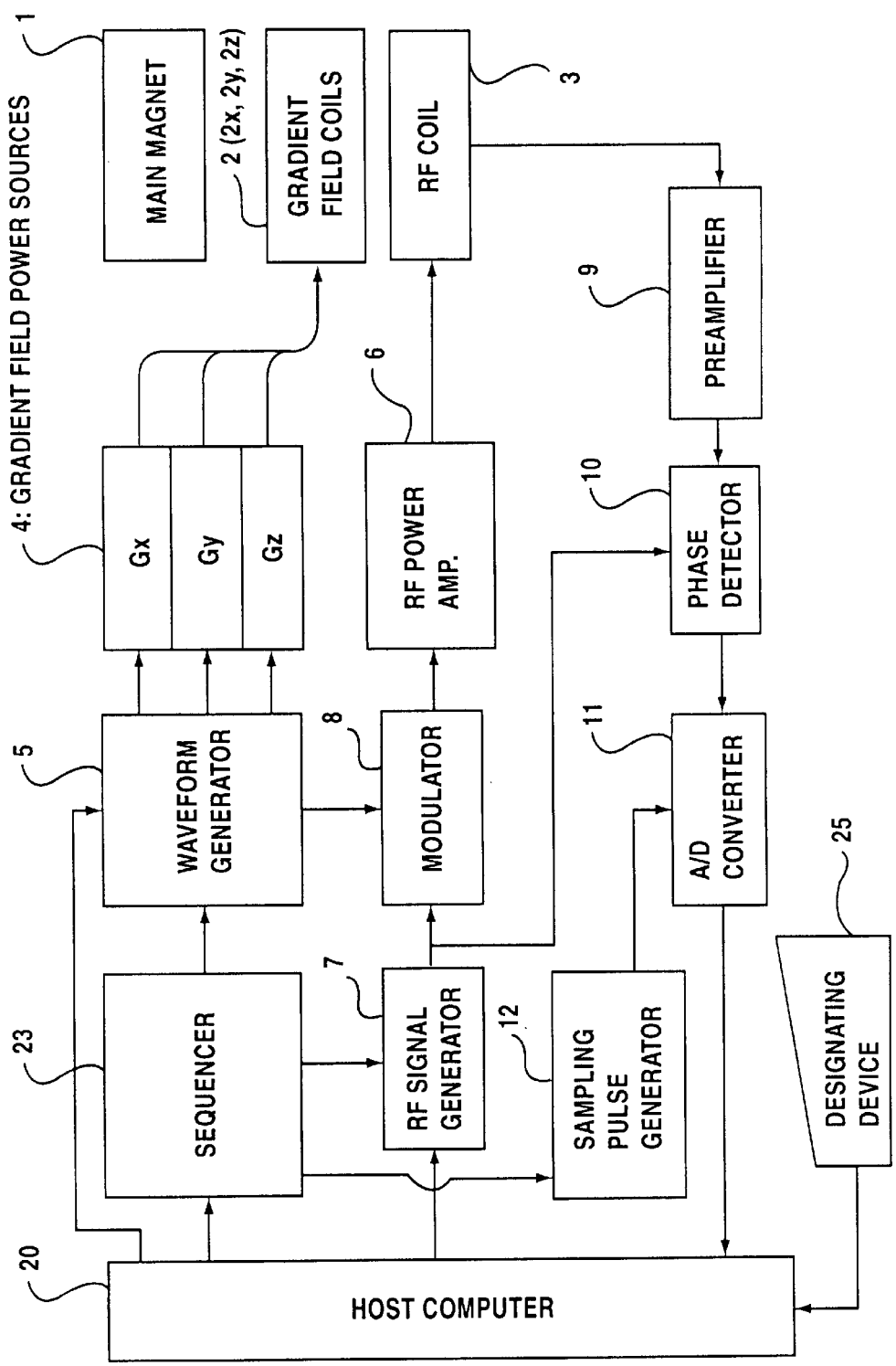
FIG. 3 is a block diagram of an MR imaging apparatus according to this invention.

An MR imaging apparatus will be described first with reference to FIG. 3. Numeral 1 denotes a main magnet for forming a static magnetic field. The main magnet 1 has three gradient field coils 2 (i.e. 2x, 2y and 2z) for superimposing gradient magnetic fields on the static magnetic field. The three gradient field coils 2x, 2y and 2z superimpose, on the uniform static field formed by the main magnet 1, pulses for three gradient fields Gs, Gp and Gr (i.e. a slice-selecting gradient field pulse, a phase-encoding gradient field pulse, and a reading gradient field pulse) each having a field strength varying in three orthogonal directions (X, Y and Z). An examinee (patient), not shown, is placed in an imaging space (static magnetic field space) where the static and gradient fields are formed, with a RF coil 3 attached to the examinee.

Gradient field power sources 4 are connected to the gradient field coils 2 to supply power for generating the gradient fields Gx, Gy and Gz. The gradient field power sources 4 receive waveform signals from a waveform generator 5 to control waveforms of the gradient fields Gx, Gy and Gz. The RF coil 3 receives a RF signal from a RF power amplifier 6 to irradiate the examinee with the RF signal. This RF signal results from an amplitude modulation effected by a modulator 8, according to a waveform received from the waveform generator 5, on a RF signal of a predetermined carrier frequency generated by a RF signal generator 7.

The RF coil 3 receives echo signals generated in the examinee, and transmits these signals through a preamplifier 9 to a phase detector 10. The phase detector 10 detects phases of the signals received, using the RF signal from the RF signal generator 7 as a reference frequency. Results of the detection are outputted to an analog-to-digital (A/D) converter 11. The A/D converter 11 also receives sampling pulses from a sampling pulse generator 12 for use in converting the detection results into digital data. The digital data are given to a host computer 20.

The host computer 20, which acts as a data processing device, processes the data to reconstruct an image, and determines timing of an overall sequence through a sequencer 23. That is, the sequencer 23, under the control of the host computer 20, transmits timing signals to the waveform generator 5, RF signal generator 7 and sampling pulse generator 12 to determine timing of waveform signal output from the waveform generator 5, timing of RF signal generation by the RF signal generator 7, and timing of sampling pulse generation by the sampling pulse generator 12. Further, the host computer 20 transmits waveform information to the waveform generator 5 to control the waveform, strength and the like of the pulses for the gradient fields Gx, Gy and Gz, and to determine an envelope of the RF signal emitted from the RF coil 3 to the examinee. The host computer 20 also transmits a signal to the RF signal generator 7 to control the carrier frequency of the RF signal. A designating device 25 corresponding to the designating means of this invention and comprising a keyboard or the like connected to the host computer 20 is operable to input a value relating to an order within a spin echo group described hereinafter. Based on the value inputted, the host computer 20 controls the waveform generator 5 to adjust the polarity and strength of the pulses for the gradient fields Gp. Thus, the host computer 20 controls the overall pulse sequence based on the GRASE method as described hereinafter.

The above MR imaging apparatus, under control of the computer 20 and sequencer 23, executes a pulse sequence as shown in FIGS. 4A–4E. The pulse sequence shown in FIGS. 4A–4E is based essentially on the GRASE method with an improved phase encoding procedure.

The echo signals having the same place in the order of generation within the respective intervals between refocus RF pulses 101 and 102, between refocus RF pulses 102 and 103, and after refocus RF pulse 103, are grouped together to form a group of gradient echo signals S1, S4 and S7, a group of spin echo signals S2, S5 and S8 and a group of gradient echo signals S3, S6 and S9. The order in which the echo signals are listed within each group represents an order of signal generation. The order within each group is called hereinafter the order within the gradient echo group or the order within the spin echo group. In this embodiment, therefore, the order within each group comprises three places, i.e. first, intermediate and last.

In the following description, the designating device 25 is first operated to input a value relating to the order within the spin echo group. The value inputted is the number of an echo signal indicating its place in the order of spin echo generation. It is assumed here that the first value, i.e. the echo number of spin echo signal S2(SE 1), is inputted. The value relating to the order within the spin echo group may be an echo time as described hereinafter, instead of the number of a spin echo signal. A varied value may be employed as long as it indicates a place the order within the spin echo group.

<"First" in the Order within the Spin Echo Group>
(Basic Arrangement)

First, as shown in FIGS. 4A and 4B, one 90° pulse (also called excitation RF pulse) 100 is applied through the RF coil 3, and simultaneously therewith a pulse 110 is applied through the gradient field coil 2z to form a slice-selecting gradient field Gs. Then, a 180° pulse (also called refocus RF pulse) 101 is applied upon lapse of time τ from application of the 90° pulse 100, and a 180° pulse 102 upon lapse of time 2 τ from the 180° pulse 101. In this way, 180° pulses 101, 102 and 103 are applied successively along with slice-selecting gradient field pulses 111, 112 and 113.

In this case, as shown in FIG. 4E, a first spin echo signal S2(SE1) is generated around a point of time delayed from the 180° pulse 101 by a period of time corresponding to the period of time τ between the 90° pulse 100 and 180° pulse 101. Here, the time taken from the 90° pulse 100 to the echo center of spin echo signal S2(SE1) (echo time 2 τ) is regarded as time t1.

Assuming that the echo time from the 90° pulse 100 to the echo center of spin echo signal S2 is t1 as noted above, the first 180° pulse 101 is set to t=(1/2)t1=τ, where the 90° pulse 100 is regarded as time origin (t=0). Thus, emission time of an "n"th 180° pulse ("n" being a positive integer) is set to {2(n−1)+1}τ. That is, by setting emission times of 180° pulses 101, 102 and 103 to t=τ, t=(3/2)t1=3τ, and t=(5/2)t1=5τ, respectively, spin echo signals S2(SE1), S5(SE2) and S8(SE3) are generated at points of time t1, t2 and t3, respectively. Thus, the periods of time t2 and t3 from the 90° pulse 100 to generation of the second and subsequent spin echo signals S5(SE2) and S8(SE3) correspond to the period of time t1 from the 90° pulse 100 to generation of the first spin echo signal S2 multiplied by integers, i.e. t2=2t1 and t3=3t1.

By controlling emission timing of the 180° pulses 101, 102 and 103 as above, spurious spin echo signals due to imperfection of the 180° pulses are generated at the same points of time as the proper spin echo signals to suppress phase shift. In this way, the spurious spin echo signals may also be used as stimulated spin echo signals for image formation In order to obtain varied contrast levels as described hereinafter, it is preferable to adjust the emission timing of the 90° pulse 100 and 180° pulses 101, 102 and 103 such that the periods of time until generation of the respective spin echo signals (echo times) are in the ranges t1=10 to 20 ms, t2=20 to 40 ms, and t3=30 to 60 ms. Thus, in this example, the RF pulses preferably are emitted in the range τ=5 to 10 ms.

Reference is made to FIG. 4C. A dephasing gradient pulse 120 for disarraying the spin phase of protons is applied through the gradient field coil 2x before the first 180° pulse 101. Subsequently, during the period between 180° pulses 101 and 102, the polarity of the pulses for forming gradient fields Gr is switched three times (121a, 121b and 121c), for example, to generate echo signals S1–S3 during this period. Similarly, the polarity of the pulses for forming gradient fields Gr is switched during the period between the second 180° pulse 102 and third 180° pulse 103 and after the third 180° pulse 103, to generate three echo signals S4–S6 or S7–S9 during each period. The middle echo signals S2, S5 and S8 among these echo signals S1–S9 are spin echo signals SE1–SE3 free from phase errors due to non-uniformity of the static magnetic field formed by the main magnet 1 or due to chemical shifts. The other echo signals are gradient echo signals GE1–GE6.

As shown in FIG. 4E, the echo signals S1–S9 have strengths diminishing in the order of generation thereof. The time constants for this attenuation are transverse relaxation times T2 and T2*. Specifically, the spin echo signals SE1–SE3 unaffected by the non-uniformity of the static magnetic field attenuate with the transverse relaxation time T2 (also called spin-spin relaxation time since an energy exchange takes place between the spins), while the gradient echo signals GE1–GE6 influenced by the non-uniformity of the static magnetic field attenuate with the transverse relaxation time T2* involving a faster attenuation due to the non-uniformity of the static magnetic field than time constant T2.

As shown in FIG. 4D, the phase-encoding gradient field pulses Gp are applied through the gradient field coil 2y to provide the respective echo signals S1–S9 with different integrated phase encode amounts.

Reference is made to FIGS. 4A through 4E.

Figure 6A:
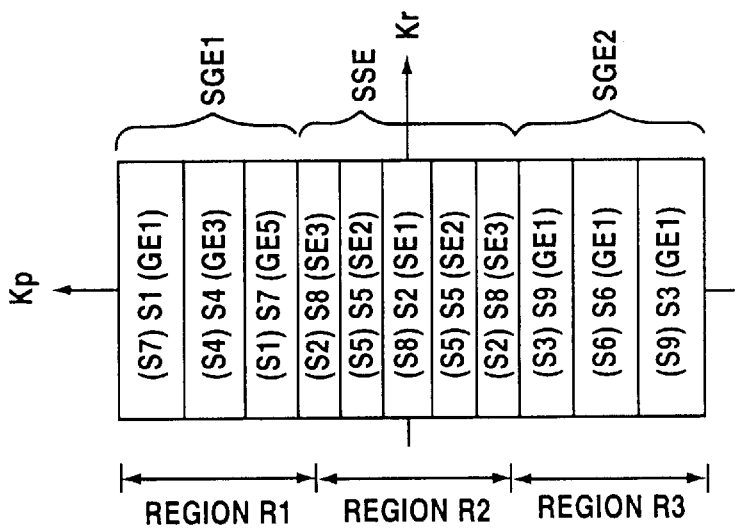
FIGS. 6A and 6B are schematic views showing phase encoding and an arrangement of echo signals in a k-space in the first embodiment.

Gp pulse 201a applied after the first 180° pulse 101 and before generation of the echo signal S1 has positive polarity, and the greatest amplitude or phase encode amount of all phase encode amounts applied to the echo signals S1, S4 and S7. Consequently, as shown in FIG. 6A, the data acquired from the gradient echo signal S1(GE1) is placed in the uppermost position in a positive region in the vertical direction (phase-encoding direction Kp) of a k-space. Gp pulse 201b applied before generation of the next echo signal S2 has negative polarity and has a slightly smaller absolute value than Gp pulse 201a already applied. Gp pulse 201b has an amplitude to provide an integrated amount close to zero in the phase-encoding direction Kp. Consequently, the data acquired from the spin echo signal S2(SE1) is placed in the middle region to the positive side of the k-space downwardly remote from the data of gradient echo signal S1(GE1). Gp pulse 201c applied before generation of the next echo signal S3 has the same polarity and amplitude as the preceding Gp pulse 201b. Consequently, the data acquired from the gradient echo signal S3(GE2) is placed in a negative region downwardly remote from the data of spin echo signal S2(SE1). Then, a rewind pulse 201d is applied before the next 180° pulse 102 to cancel the phase encoding effected up to this point.

Gp pulse 202a applied after the second 180° pulse 102 and before generation of echo signal S4 has positive polarity and a slightly smaller amplitude than Gp pulse 201a applied to the gradient echo signal S1(GE1). Consequently, the data acquired from the gradient echo signal S4(GE3) is placed in a position in the k-space immediately below the data acquired from the gradient echo signal S1(GE1). Gp pulse 202b applied before generation of the next echo signal S5 has negative polarity and an amplitude to provide a positive integrated amount in combination with Gp pulse 202a already applied. Consequently, the data acquired from spin echo signal S5(SE2) is placed in a position in the k-space downwardly spaced from the gradient echo signal S4(GE3). For the next echo signal S6, GP pulse 202c is applied which has reversed polarity from and the same amplitude as Gp pulse 202a applied to the gradient echo signal S4(GE3). Thus, the data acquired therefrom is placed in a position in the k-space downwardly spaced from the spin echo signal S5(SE2) by an amount corresponding to the spacing from near zero to the gradient echo signal S4(GE3). Then, a rewind pulse 202d is applied as before.

Gp pulse 203a applied after the third 180° pulse 103 and before generation of echo signal S7(GE5) has positive polarity and the smallest of the phase encode amounts applied to the echo signals S1, S4 and S7. Consequently, the data acquired from the gradient echo signal S7(GE5) is placed in a position in the k-space immediately below the echo signal S4(GE3). Gp pulse 203b applied before generation of the next echo signal S8(SE3) has negative polarity and the smallest amplitude. The data acquired from the spin echo signal S8(SE3) is placed in a position in the k-space immediately below the gradient echo signal S7(GE5). Gp pulse 203c applied before generation of the next echo signal S9 has negative polarity and a slightly smaller amplitude than the Gp pulse 202c already applied to the echo signal S6(GE4). Consequently, the data acquired from the gradient echo signal S9(GE6) is placed in a position in the k-space immediately above the gradient echo signal S6(GE4). Then, a rewind pulse 203d is applied as before.

The above phase encoding procedure is repeated a predetermined number of times by reducing the phase-encoding gradient field pulses 201a, 202a and 203a by predetermined amounts (see arrows in FIG. 4D).

Figure 6B:
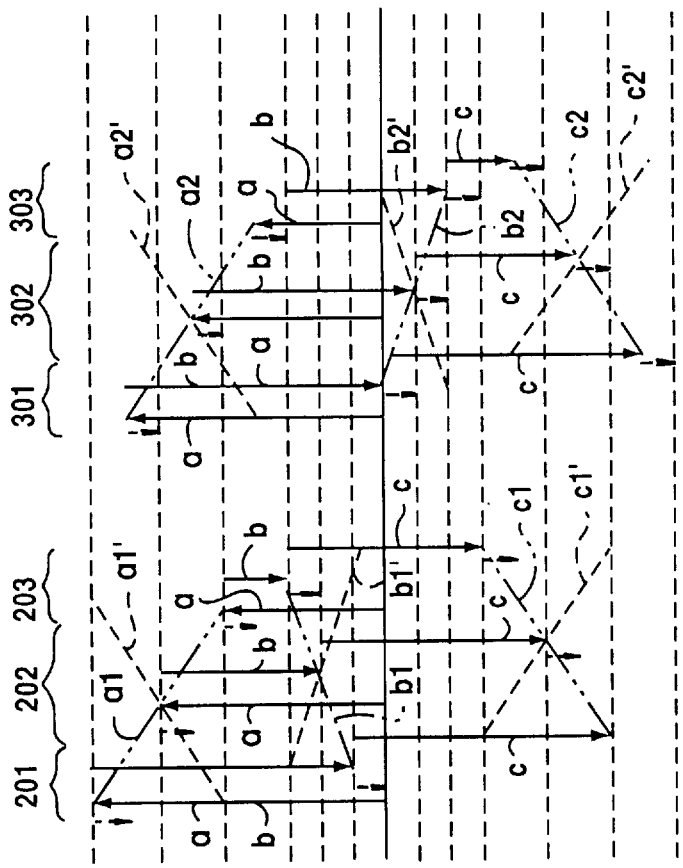

FIG. 6B schematically shows the integrated phase encode amounts provided as above. In this figure, the integrated amount for each Gp pulse is shown by a distance between the arrow tip of the Gp pulse and the zero point on the phase encoding axis Kp of the k-space. The phase encode amounts are set as follows.

First, among the gradient echo signals S1(GE1), S4(GE3) and S7(GE5) which are first in the order of generation, i.e. in the first gradient echo group SGE1, the gradient echo signal S1(GE1) is first in the order within the gradient echo group. This gradient echo signal S1(GE1) is given such an integrated phase encode amount as to be placed in the uppermost position of the first gradient echo group SGE1 in the k-space. The integrated encode amount varies to describe a negative gradient (as shown in two-dot-and-dash line a1 in FIG. 6B) in the order of generation, i.e. has decreasing absolute values. Next, among the spin echo signals S2(SE1), S5(SE2) and S8(SE3) which are intermediate in the order of generation, i.e. in the spin echo group SSE, the spin echo signal S2(SE1) is first in the order within the spin echo group. The spin echo signal S2(SE1) is given such an integrated phase encode amount as to be placed in the middle position of the spin echo group SSE in the k-space, i.e. adjacent zero on the Kp axis of the k-space. The integrated encode amount varies to describe a positive gradient (as shown in two-dot-and-dash line b1 in FIG. 6B) in the order of generation, i.e. has increasing absolute values. Among the gradient echo signals S3(GE2), S6(GE4) and S9(GE6) which are last in the order of generation, i.e. in the second gradient echo group SGE2, the gradient echo signal S3(GE2) is first in the order within the gradient echo group. This gradient echo signal S3(GE2) is given such an integrated phase encode amount as to be placed in the lowermost position of the second gradient echo group SGE2 in the k-space. The integrated encode amount varies to describe a positive gradient in the negative region on the Kp axis (as shown in two-dot-and-dash line c1 in FIG. 6B) in the order of generation, i.e. has decreasing absolute values.

Phase encoding is applied to the echo signals S1–S9 as described above. Consequently, as shown in FIG.6A, the upper halves of lines of the respective gradient echo signals in the first gradient echo group SGE1 in the k-space are filled with the data acquired therefrom. The lines in the upper half of the spin echo group SSE (the upper half of region R2) are filled with the data acquired therefrom. The upper halves of lines of the respective gradient echo signals in the second gradient echo group SGE2 are filled with the data acquired therefrom.

As shown in FIGS. 5A and 5B, the phase-encoding gradient field pulses Gp are applied through the gradient field coil 2y again to provide the respective echo signals S1–S9 with different integrated phase encode amounts. The RF pulses 101–103 (FIG. 4A), slice-selecting gradient field pulses 110–113 (FIG. 4B) and reading gradient field pulses 121a, b, c–123a, b, c (FIG. 4C) are the same as those already described, and are omitted from FIGS. 5A and 5B.

Gp pulse 301a applied after the first 180° pulse 101 and before generation of the echo signal S1 has positive polarity and an amplitude slightly smaller than Gp pulse 201a applied to the echo signal S1 before but greater than Gp pulses 302a and 303a subsequently applied to the echo signals S4 and S7. Consequently, as shown in FIG. 6A, the data acquired from the gradient echo signal S1(GE1) is placed in the positive region in the vertical direction of the k-space and below the line already filled. Gp pulse 301b applied to the next echo signal S2 has negative polarity and has the same amplitude as Gp pulse 301a already applied, which provides an integrated amount close to zero. Consequently, the data acquired from the spin echo signal S2(SE1) is placed in the middle region to the positive side of the k-space downwardly remote from the data of gradient echo signal S1(GE1) and below the line already filled with the data of spin echo signal S2(SE1). Gp pulse 301c applied to the next echo signal S3(GE2) has the same polarity and amplitude as the preceding Gp pulse 301b. Consequently, the data acquired from the gradient echo signal S3(GE2) is placed in a negative position downwardly remote from the data of spin echo signal S2(SE1) by the same spacing in the k-space between the data acquired from the gradient echo signal S1(GE1) and spin echo signal S2(SE1), and below the line already filled. Then, a rewind pulse 301d is applied before the next 180° pulse 102.

Gp pulse 302a applied after the second 180° pulse 102 and before generation of echo signal S4 has positive polarity and a slightly smaller amplitude than Gp pulse 301a applied to the gradient echo signal S1(GE1). Consequently, the data acquired from the gradient echo signal S4(GE3) is placed in a position in the k-space immediately below the gradient echo signal S1(GE1) and below the line already filled. Gp pulse 302b applied to the next echo signal S5 has negative polarity and a slightly larger absolute value than Gp pulse 302a already applied. Consequently, the data acquired from spin echo signal S5(SE2) is placed in a negative position in the k-space immediately below the spin echo signal S2(SE1). GP pulse 302c applied to the next echo signal S6 has reversed polarity and a smaller absolute value than Gp pulse 302b already applied. Consequently, the data acquired from the gradient echo signal S6(GE4) is placed in a position in the k-space immediately above the gradient echo signal S3(GE2) and below the line already filled with the gradient echo signal S6(GE4). Then, a rewind pulse 302d is applied as before.

Gp pulse 303a is applied after the third 180° pulse 103 and before generation of echo signal S7(GE5), which has positive polarity and a smaller amplitude than the Gp pulses applied to the gradient echo signals S1 and S4. Consequently, the data acquired from the gradient echo signal S7(GE5) is placed in the lowermost position of the first echo group SGE1 and in the already filled line immediately below the echo signal S4(GE3). Gp pulse 303b is applied to the next echo signal S8(SE3), whereby the data acquired from the spin echo signal S8(SE3) is placed in a position in the k-space immediately below the spin echo signal S5(SE3). Gp pulse 303c applied to the next echo signal S9(GE6) has negative polarity, and the resulting data is placed immediately below the spin echo signal S8(SE3) and below the already filled line. Then, a rewind pulse 303d is applied as before.

As in the case of the first series of phase-encoding gradient field pulses, the above phase encoding procedure is repeated a predetermined number of times by reducing the phase-encoding gradient field pulses 301a, 302a and 303a by predetermined amounts (see arrows in FIG. 5A).

FIG. 6B schematically shows the integrated phase encode amounts provided as above. First, among the gradient echo signals S1(GE1), S4(GE3) and S7(GE5) which are first in the order of generation, i.e. in the first gradient echo group SGE1, the gradient echo signal S1(GE1) is first in the order within the gradient echo group. This gradient echo signal S1(GE1) is given such an integrated phase encode amount as to be placed in the uppermost position of the first gradient echo group SGE1 in the k-space. The integrated encode amount varies to describe a negative gradient (as shown in two-dot-and-dash line a2 in FIG. 6B) in the order of generation, i.e. has decreasing absolute values. Next, among the spin echo signals S2(SE1), S5(SE2) and S8(SE3) which are intermediate in the order of generation, i.e. in the spin echo group SSE, the spin echo signal S2(SE1) is first in the order within the spin echo group. The spin echo signal S2(SE1) is given such an integrated phase encode amount as to be placed in the middle position of the spin echo group SSE in the k-space, i.e. adjacent zero on the Kp axis of the k-space. The integrated encode amount varies to describe a negative gradient (as shown in two-dot-and-dash line b2 in FIG. 6B) in the order of generation, i.e. has increasing absolute values. Among the gradient echo signals S3(GE2), S6(GE4) and S9(GE6) which are last in the order of generation, i.e. in the second gradient echo group SGE2, the gradient echo signal S3(GE2) is first in the order within the gradient echo group. This gradient echo signal S3(GE2) is given such an integrated phase encode amount as to be placed in the lowermost position of the second gradient echo group SGE2 in the k-space. The integrated encode amount varies to describe a positive gradient in the negative region on the Kp axis (as shown in two-dot-and-dash line c2 in FIG. 6B) in the order of generation, i.e. has decreasing absolute values.

Phase encoding is applied to the echo signals S1–S9 as described above. Consequently, as shown in FIG. 6A, the lower halves of lines of the respective gradient echo signals in the first gradient echo group SGE1 in the k-space are filled with the data acquired therefrom. The lines in the lower half of the spin echo group SSE (the lower half of region R2) are filled with the data acquired therefrom. The lower halves of lines of the respective gradient echo signals in the second gradient echo group SGE2 are filled with the data acquired therefrom.

The k-space has, for example, 256 lines arranged along the Kp axis, and data for 28 lines are collected from each echo (since 256 lines/9 echoes=28.44 . . . , and the number of lines along the Kp axis of the k-space is set as 28×9 echoes=252 lines). In the first pulse sequence, therefore, the integrated phase encode amount is varied to collect data for 14 lines (=28 lines/twice), and subsequently data are collected for the same 14 lines. The above data collecting procedure is one example. Alternatively, a data collection for 7 lines may be repeated four times to collect data for the 252 lines.

The gradient echo signals having the same place in the order of generation in the respective intervals between the 180° pulses 101–103 are grouped, i.e. into the first gradient echo signal group SGE1 and second gradient echo signal group SGE2. These signals are arranged in the upper peripheral region R1 and lower peripheral region R3 which are high frequency regions of the k-space, in the order of generation, in each gradient echo group, from the first echo signal S1(GE1) or S3(GE2) toward the middle position, i.e. in ascending order from a peripheral position toward the middle position. The spin echo group is placed in the region R2 which is a low frequency region of the k-space, with the spin echo signals arranged in ascending order toward the opposite peripheral ends from the reference spin echo signal S2(SE1) placed adjacent zero on the Kp axis.

Figure 7:
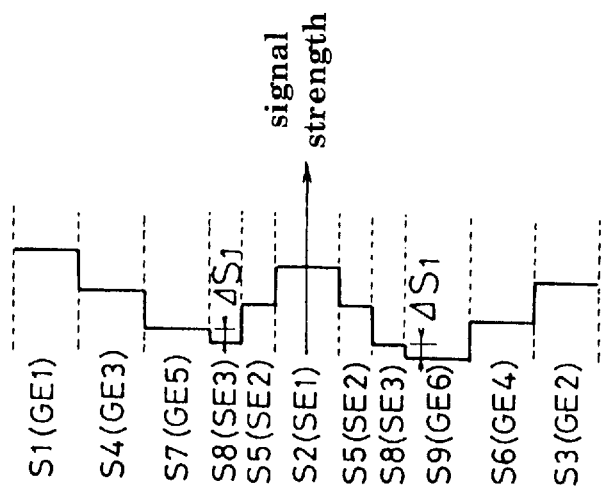
FIG. 7 is a schematic view showing signal strengths in the case of "first" in the order within the spin echo group.

FIG. 7 shows the signal strengths of the data arranged in the k-space. The echo signals S1–S9 attenuate with time constants T2 and T2* as noted hereinbefore. In the spin echo group SSE, the signals are arranged uniformly, in the order of generation, toward the peripheral positions from the spin echo signal SE1 (reference spin echo signal) which is first in the order of generation. Thus, the signal strengths of the spin echo group SSE present an upwardly arched profile when the Kp axis is seen as a horizontal axis, with the signals uniformly attenuating toward the opposite peripheral positions. In each of the first and second gradient echo groups SGE1 and SGE2, the signals are arranged according to the order within the gradient echo group from the peripheral position toward the middle position. Thus, each group has a signal strength profile uniformly attenuating from the peripheral position of the region R1 or R2 toward the region R2. Consequently, a reduced difference ΔS1 in signal strength occurs at the boundary between the spin echo group SSE and each of the first gradient echo group SGE1 and second gradient echo group SGE2 at opposite sides. The difference in echo signal number is 1 at the boundary between the first gradient echo group SGE1 and the spin echo group SSE (with the gradient echo signal S7 and spin echo signal S8), and also at the boundary between the spin echo group SSE and the second gradient echo group SGE2 (with the spin echo signal S8 and gradient echo signal S9). The difference in number between adjacent echo signals, which relates to the echo signal strength attenuating in the order of generation, is 1, the minimum, at each boundary. This also shows that the difference in signal strength is minimized at each boundary. That is, the difference in signal strength is diminished at the boundaries between the respective groups. Consequently, when an image is reconstructed through a two-dimensional Fourier transform of the k-space, image blurring artifacts are suppressed to realize excellent image quality.

<"Last" in the Order within the Spin Echo Group>

Next, a case will be described briefly where the last value in the order within the spin echo group, e.g. the echo number of spin echo signal S8(SE3), is inputted through the designating device 25.

In the first pulse sequence, as shown in a dotted line in FIG. 6B, the phase-encoding gradient field pulses 201a–203a are applied to the respective echo signals S1, S4 and S7 in the first gradient echo group SGE1 to describe a positive gradient according to the order within the gradient echo group, i.e. with successively increasing absolute values of the integrated phase encode amount (dotted line a1' in FIG. 6B). Next, GP pulses 201b–203b are applied to the respective echo signals S2, S5 and S8 in the spin echo group SSE to describe a negative gradient according to the order within the spin echo group, i.e. with successively decreasing absolute values of the integrated phase encode amount (dotted line b1' in FIG. 6B). Further, GP pulses 201c–203c are applied to the respective echo signals S3, S6 and S9 in the second gradient echo group SGE2 to describe a negative gradient according to the order within the gradient echo group, i.e. with successively increasing absolute values of the integrated phase encode amount (dotted line c1' in FIG. 6B).

In the next pulse sequence, the phase-encoding gradient field pulses 301a–303a are applied to the first gradient echo group SGE1 to describe a positive gradient according to the order within the gradient echo group, i.e. with successively increasing absolute values of the integrated phase encode amount (dotted line a2' in FIG. 6B). Next, GP pulses 301b–303b are applied to the spin echo group SSE to describe a positive gradient according to the order within the spin echo group, i.e. with successively decreasing absolute values of the integrated phase encode amount (dotted line b2' in FIG. 6B). Further, GP pulses 301c–303c are applied to the second gradient echo group SGE2 to describe a negative gradient according to the order within the gradient echo group, i.e. with successively increasing absolute values of the integrated phase encode amount (dotted line c2' in FIG. 6B).

The data acquired from the echo signals S1–S9 are arranged in the k-space in the order of generation opposite to the arrangement in the <"First" in the Order within the Spin Echo Group> described hereinbefore. The echo signal numbers in the spin echo group SSE are arranged in descending order from the middle position toward the opposite peripheral positions. The echo signal numbers in each of the first and second gradient echo groups SGE1 and SGE2 are arranged in descending order from the peripheral position toward the middle position (as in parentheses in FIG. 6A).

Figure 8:
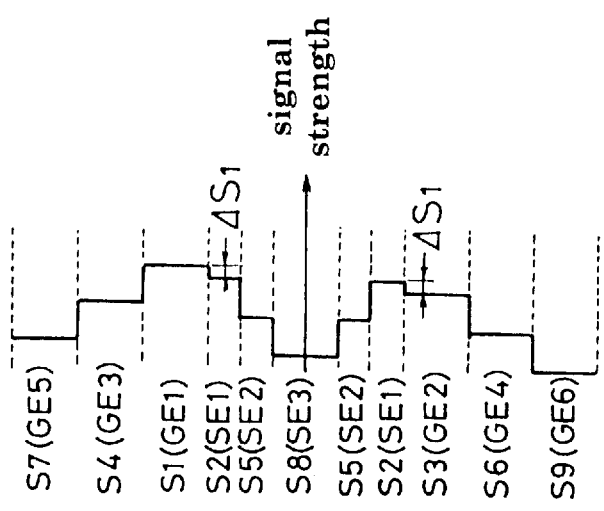
FIG. 8 is a schematic view showing signal strengths in the case of "last" in the order within the spin echo group.

FIG. 8 shows the signal strengths of the data arranged in the k-space as above. The echo signals S1–S9 attenuate with time constants T2 and T2* as noted hereinbefore. In the spin echo group SSE, the signals are arranged uniformly, in the order opposite to the order of generation, toward the peripheral positions from the spin echo signal SE8 (reference spin echo signal) which is last in the order within the spin echo group. Thus, the signal strengths of the spin echo group SSE present a vertically recessed profile when the Kp axis is seen as a horizontal axis, with the strengths uniformly increasing from the middle position toward the opposite peripheral positions. In each of the first and second gradient echo groups SGE1 and SGE2, the signals are arranged in the order opposite to the order within the gradient echo group from the peripheral position toward the middle position. Thus, each group has a signal strength profile uniformly increasing from the peripheral position of the region R1 or R2 toward the middle position. Consequently, as in the foregoing case, a reduced difference ΔS1 in signal strength occurs at the boundary between the spin echo group SSE and each of the first gradient echo group SGE1 and second gradient echo group SGE2 at opposite sides. As described hereinbefore, the difference in echo signal number is 1 at each boundary, i.e. the minimum signal difference at each boundary. Consequently, as in the foregoing case, an image of excellent image quality is reconstructed, with image blurring artifacts suppressed, through a two-dimensional Fourier transform of the k-space.

Where the spin echo signal S2(SE1) which is first in the order within the spin echo group is placed in the middle position of the spin echo group SSE (FIG. 7), the shortest time (i.e. shortest echo time) t1 is taken from application of 90° pulse 100 to generation of this signal as shown in FIG. 4E. The image reconstructed through a two-dimensional Fourier transform of this k-space is a proton density weighted image without T2-relaxation information.

On the other hand, where the spin echo signal S8(SE3) which is last in the order within the spin echo group is placed in the middle position of the spin echo group SSE (FIG. 8), the longest echo time t3 is taken. The image reconstructed from this k-space may be a heavy T2-weighted image with whitened water components.

That is, while suppressing image blurring artifacts, the contrast of the reconstructed image may be adjusted by varying the values relating to the order within the spin echo group as noted above.

<"Intermediate" in the Order within the Spin Echo Group> (Shift Arrangement)

Next, a case will be described where an intermediate value relating to the order within the spin echo group, e.g. the spin echo signal S5(SE2), is inputted through the designating device 25.

When an intermediate value is designated as a place in the order within the spin echo group, the integrated phase encode amounts are adjusted as set out below based on the <"First" in the Order within the Spin Echo Group>. While the following description is made exemplifying the "first" in the order within the spin echo group, the integrated phase encode amounts may be adjusted likewise when based on the "last" in the order within the spin echo group.

As shown in FIG. 9A, the basic arrangement is based on the "first" in the order within the spin echo group. Only the spin echo group SSE in the arrangement of FIG. 9A is shifted downward by n lines, so that the spin echo signal S5(SE2) acting as a reference spin echo signal designated through the designating device 25 (in this example, the upper one, shown in hatching, of the two spin echo signals S5) is placed in the middle position in the middle region R2 of the k-space (FIG. 9B). That is, the integrated phase encode amounts are once reduced by amounts corresponding to n lines.

Then, the spin echo signal group partly protrudes downward from the region R2. The protruding spin echo signals are those less, by n lines, than the smallest integrated phase encode amount (i.e. minimum integrated amount) applied to the spin echo group SSE in the region R2 in the basic arrangement. The strengths of the phase-encoding gradient field pulses Gp are varied for these spin echo signals. Consequently, the greatest of the integrated phase encode amounts for these signals is made a new integrated phase encode amount corresponding to the greatest integrated phase encode amount (i.e. maximum integrated amount) for the spin echo group SSE. The decreasing integrated phase encode amounts of the protruding spin echo signals are made new integrated phase encode amounts successively decreasing from the maximum integrated amount.

This aspect will particularly be described with reference to FIGS. 9B and 9C. In the spin echo group SSE, a half of the spin echo signals S5(SE2) and both of the spin echo signals S8(SE3) are less than minimum integrated amount min2. The new phase encode amount of the spin echo signal S5(SE2) which has the greatest integrated amount among these signals is made maximum integrated amount max2 of the spin echo group SSE. The new integrated amounts of the spin echo signal S8(SE3) are made smaller than that of the spin echo signal S5(SE2). Thus, the spin echo signals S2(SE1), S8(SE3) and S5(SE2) successively protruding downward from the region R2 of the spin echo group SSE are circulated to be placed in the opposite upper position, thereby retaining the order in the basic arrangement.

The first gradient echo group SGE1 and second gradient echo group SGE2 have the basic arrangements shown in FIG. 9A which is regarded as one unit (FIG. 10A). The gradient echo groups are shifted by twice n lines, i.e. 2n lines (hereinafter called m lines), in the same direction the spin echo group SSE is shifted by n lines (FIG. 10B). That is, the integrated phase encode amounts are once reduced by amounts corresponding to m lines. The first and second gradient echo groups are shifted by twice the shift amount n of the spin echo group SSE in order to retain the above basic arrangements since the two gradient echo groups SGE1 and SGE2 include the number of echo signals twice the number of echo signals included in the spin echo group SSE.

The first gradient echo signal group partly protrudes downward from the region R1. The protruding spin echo signals are those less than the smallest integrated phase encode amount (i.e. minimum integrated amount) applied to the first gradient echo group SGE1 in the region R1 in the basic arrangement. The strengths of the phase-encoding gradient field pulses Gp are varied for the gradient echo signals. Consequently, the greatest of the integrated phase encode amounts for these signals is made a new integrated phase encode amount corresponding to a maximum integrated phase encode amount for the second gradient echo group SGE2. The decreasing integrated phase encode amounts of the protruding gradient echo signals are made new integrated phase encode amounts successively decreasing from the maximum integrated amount of the second gradient echo group SGE2. Further, the greatest of the integrated phase encode amounts for the signals less than a minimum of the integrated phase encode amounts applied to the second gradient echo group SGE2 in the region R3 in the basic arrangement is made a new integrated phase encode amount corresponding to a maximum integrated phase encode amount for the first gradient echo group SGE1. The decreasing integrated phase encode amounts of the protruding gradient echo signals are made new integrated phase encode amounts successively decreasing from the maximum integrated amount of the first gradient echo group SGE1.

This aspect will particularly be described with reference to FIGS. 10B through 10D.

In the first gradient echo group SGE1, the lower half of the gradient echo signals S4(GE3) and both of the gradient echo signals S7(GE5) are less than minimum integrated amount min1. The new phase encode amount of the gradient echo signal S4(GE3) which has the greatest integrated amount is made maximum integrated amount max3 of the second gradient echo group SGE2. The new integrated amounts of the gradient echo signals S7(GE5) are made smaller than that of the gradient echo signal S4(GE3). In the second gradient echo group SGE2, the lower half of the gradient echo signals S6(GE4) and both of the gradient echo signals S3(GE2) are less than minimum integrated amount min3. The new phase encode amount of the gradient echo signal S6(GE4) which has the greatest integrated amount is made maximum integrated amount max1 of the first gradient echo group SGE1. The new integrated amounts of the gradient echo signals S3(GE2) are made smaller than that of the gradient echo signal S6(GE4).

Consequently, as shown in FIG. 10D, the gradient echo signals protruding downward from the region R1 of the first gradient echo group SGE1 are successively placed in the upper position of the second gradient echo group SGE2, thereby retaining the order in the basic arrangement. The gradient echo signals protruding downward from the region R3 of the second gradient echo group SGE2 are successively placed in the upper position of the first gradient echo group SGE1, thereby also retaining the order in the basic arrangement. Thus, when the first gradient echo group SGE1 and second gradient echo group SGE2 are seen as one unit, the protruding gradient echo signals are transferred to the opposite end of the other group. The above shifts result in the arrangement of echo signals in the k-space as shown in FIG. 11A.

Figure 11A:
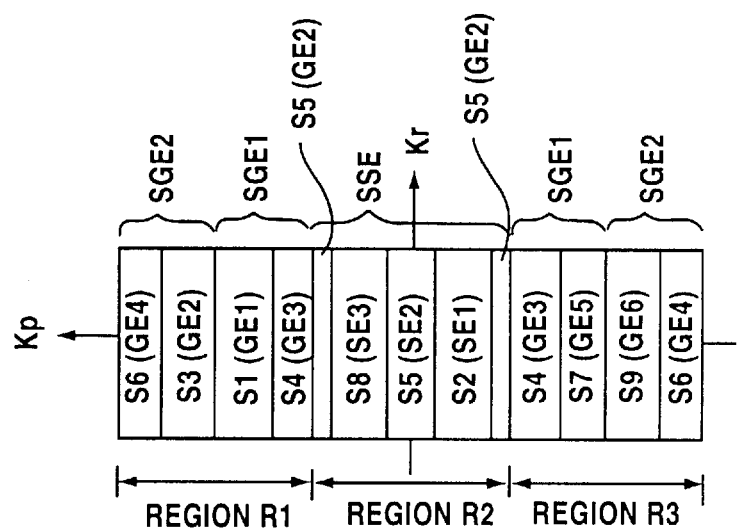
FIGS. 11A and 11B are schematic views showing phase encoding and an arrangement of echo signals in the k-space.
Figure 11B:
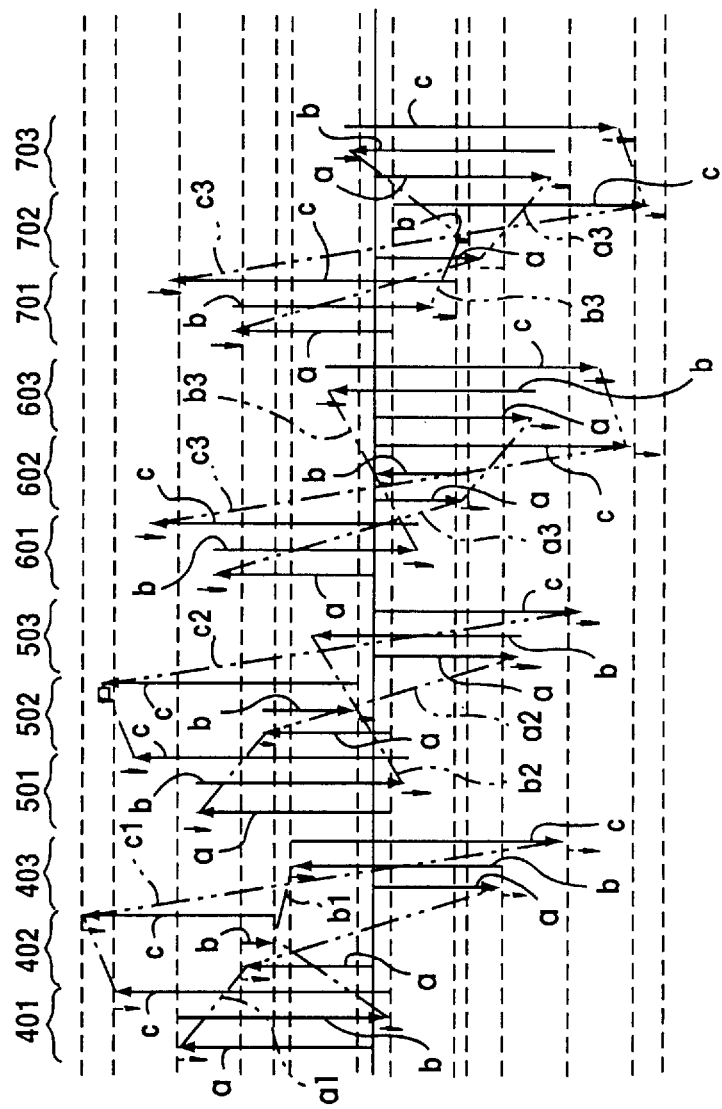

The above phase-encoding procedure may be depicted with the phase-encoding gradient field pulses Gp as shown in FIG. 11B. That is, data for 7 lines of each echo signal in the k-space may be collected by applying phase-encoding gradient field pulses comprising Gp pulses 401*a, b* and *c* to 403*a, b* and *c*, Gp pulses 501*a, b* and *c* to 503*a, b* and *c*, Gp pulses 601*a, b* and *c* to 603*a, b* and *c*, and Gp pulses 701*a, b* and *c* to 703*a, b* and *c*.

Figure 12:
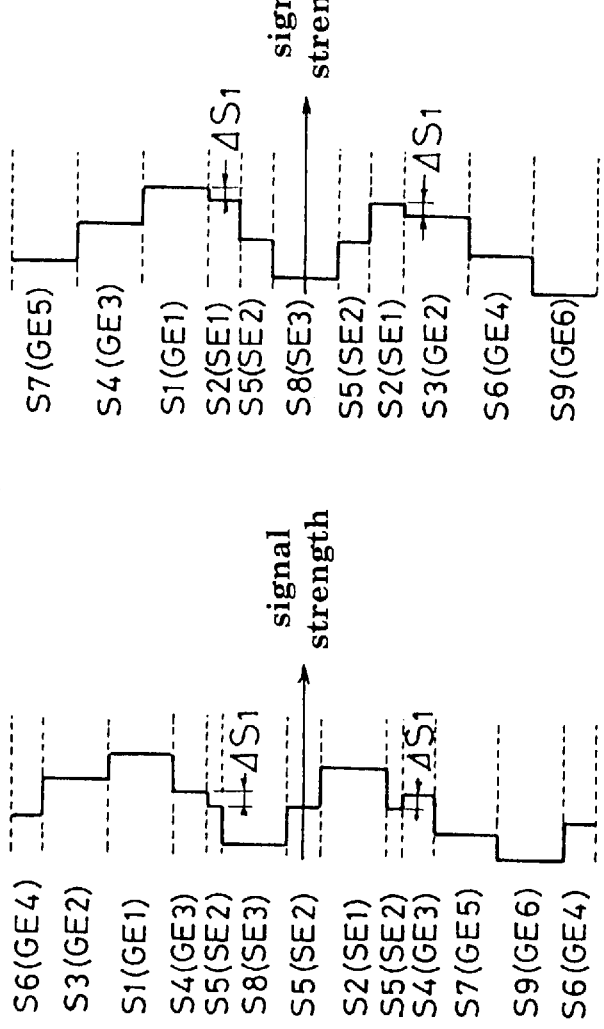
FIG. 12 is a schematic view showing signal strengths in the case of "intermediate" in the order within the spin echo group.

FIG. 12 shows the signal strengths of the data arranged in the k-space as above. For the spin echo group SSE, the signal strength profile in the <"First" in the Order within the Spin Echo Group> shown in FIG. 7 is shifted downward to place the spin echo signal S5(SE2) adjacent zero on the Kp axis. The portions protruding downward from the region R2 are transferred to the upper end of the region R2 to make a circulating shift. For the first gradient echo group SGE1 and second gradient echo group SGE2, the regions R1 and R3 having the signal strength profiles in the basic arrangement shown in FIG. 7 are combined to be handled as one. The gradient echo groups are shifted by twice the shift amount of the spin echo group SSE in the same direction. The portions protruding downward from the region R1 are transferred to the upper end of the region R3. The portions protruding downward from the region R3 are transferred to the upper end of the region R1. In this way, the gradient echo signals are circulated through the regions R1 and R3 combined. Consequently, the same reduced difference ΔS1 in signal strength is achieved at each boundary as in the basic arrangement without disturbing the signal strength profiles in the basic arrangement shown in FIG. 7. Since the difference in echo signal number also remains 1 at each boundary, the difference in signal strength is minimized at the two boundaries between the respective groups. Consequently, as in the two foregoing cases, when an image is reconstructed through a two-dimensional Fourier transform of the k-space, image blurring artifacts are suppressed to realize excellent image quality.

When the data acquired from echo signals S1–S9 are arranged in the k-space as described above, the spin echo signal S5(SE2) which is "intermediate" in the order within the spin echo group is placed in the middle position in the spin echo group SSE (region 2) (see FIG. 11A). As shown in FIG. 4E, the spin echo signal S5(SE2) has an echo time t2 intermediate between the shortest echo time t1 and the longest echo time t3. An image reconstructed through a two-dimensional Fourier transform of the k-space may be a T2-weighted image having an intermediate contrast level between proton density weighted image and heavy T2-weighted image.

The spin echo signal placed adjacent zero in the k-space may be changed by designating a value relating to the order within the spin echo group through the designating device 25. It is possible to place spin echo signals having different echo times (effective echo times) adjacent zero on the Kp axis in the k-space, thereby to adjacent the contrast of a reconstructed image.

Figure 15A:
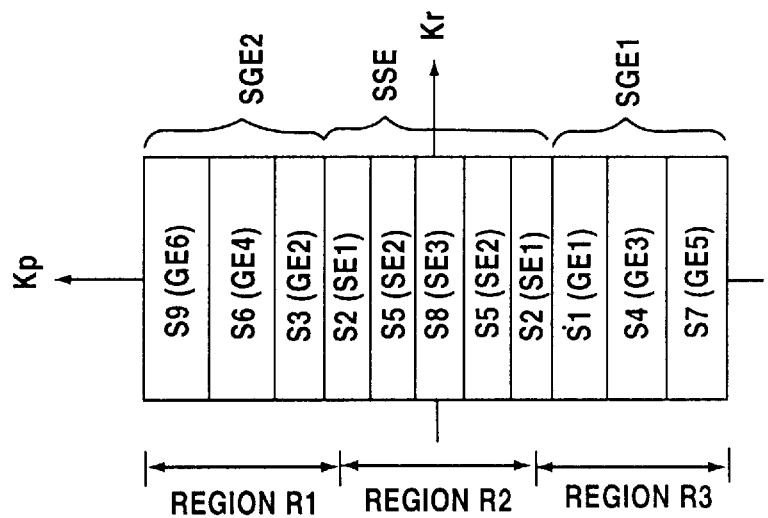
FIGS. 15A and 15B are schematic views showing phase encoding and an arrangement of echo signals in the k-space.
Figure 15B:
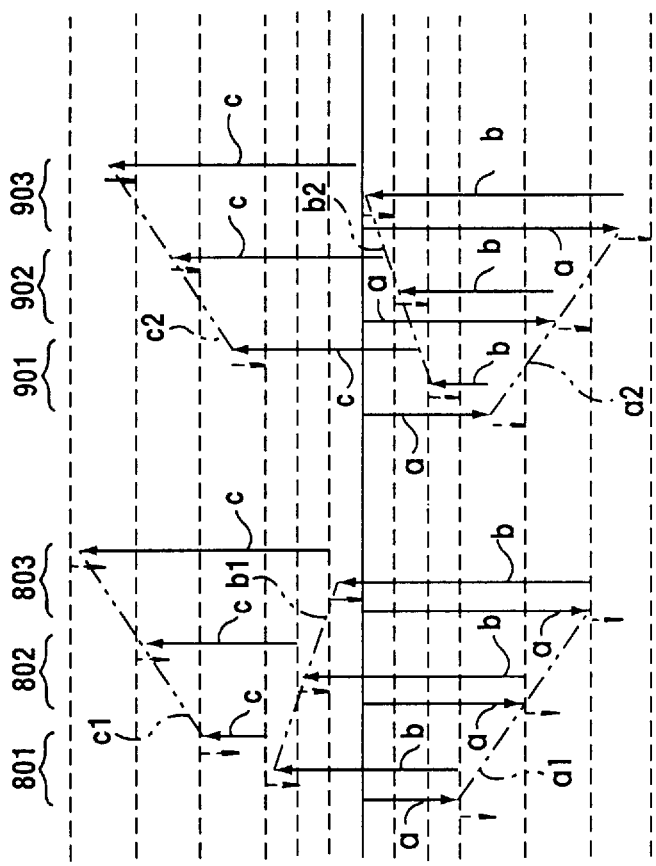

When the spin echo signal S8(SE3) which is "last" in the order within the spin echo group is designated as the reference spin echo signal, the k-space may be filled with echo signals also by shifting the echo signals downward as described above from the basic arrangement shown in FIG. 6A. That is, the spin echo group SSE is shifted downward by n lines to place the hatched spin echo signal S8(SE3) in the spin echo group SSE in FIG. 13A (the same arrangement as in FIG. 6A) adjacent zero on the Kp axis (FIGS. 13B and 13C). The first gradient echo group SGE1 and the second gradient echo group SGE2 are shifted by 2n lines (m lines) in the same direction (FIGS. 14A–14D). This results in an arrangement in the k-space as shown in FIG. 15A. Specifically, for example, Gp pulses 801a, b, c to 803a, b, c and 901a, b, c to 903a, b, c are applied to provide integrated phase encode amounts as shown in FIG. 15B.

Upon comparison between the k-space in FIG. 15A and the basic arrangement in parentheses in the k-space in FIG. 6A, it will be seen that the arrangement of spin echo signals in the spin echo group SSE is the same, but the arrangements of gradient echo signals in the first gradient echo group SGE1 and second gradient echo group SGE2 at opposite sides are interchanged between the region R1 and region R3. With this arrangement in the k-space also, the signal strength profiles thereby presented result in the difference ΔS1 in signal strength at each boundary as shown in FIG. 16. Thus, substantially the same heavy T2-weighted image as in <"Last" in the Order within the Spin Echo Group> may be obtained while suppressing image blurring artifacts.

In the foregoing description, three (i.e. an odd number of) refocus RF pulses 101–103 are applied after one excitation RF pulse 100, and the polarity of reading gradient field pulses Gr is switched three times (an odd number of times) in each interval between the pulses, to generate nine (an odd number of) echo signals S1–S9. Instead, one refocus RF pulse may be added after the refocus RF pulse 103, to make four (i.e. an even number of) refocus RF pulses, with the polarity of reading gradient field pulses Gr switched three times (an odd number of times), to generate 12 (an odd number of) echo signals in total.

In this case, of the 12 echo signals, echo signals S1, S4, S7 and S10 are gradient echo signals (in the first gradient echo group SGE1), echo signals S2, S5, S8 and S11 are spin echo signals (in the spin echo group SSE), and echo signals S3, S6, S9 and S12 are gradient echo signals (in the second gradient echo group SGE2).

When 12 echo signals are generated in one pulse sequence as above, the MR imaging apparatus according to this invention provides an arrangement of echo signals S1–S12 as shown in FIG. 17A. On the other hand, the conventional apparatus provides an arrangement as shown in FIG. 17B. In the prior art, the boundary between spin echo signal S5 and spin echo signal S8 is located adjacent zero on the Kp axis in the k-space. Naturally, a large difference ΔS2 in signal strength occurs at this boundary. The difference in signal strength adjacent zero on this Kp axis causes image blurring artifacts to appear in a reconstructed image. Therefore, the conventional GRASE method cannot employ the technique for generating 12 (i.e. an even number of) echo signals in one pulse sequence.

However, with the MR imaging apparatus according to this invention, the data collected from the same spin echo signals (only from spin echo signals S2 in this case) are arranged adjacent (on the positive and negative sides of) zero on the Kp axis, with no large difference in signal strength occurring at the zero point on the Kp axis. Thus, an increased number of lines in the k-space may be filled by generating 12 echo signals in one pulse sequence, to enable fast imaging while securing the advantage noted above.

As shown in FIG. 17C, the echo signals in the same place in the order of generation may be placed in the middle position in each of the first gradient echo group SGE1, spin echo group SSE and second gradient echo group SGE2. In this example, the gradient echo signal S1, spin echo signal S2 and gradient echo signal S3 are placed in the middle positions of the respective groups. The signal strength profile in this arrangement includes three "waves". Such "waves" also cause image blurring artifacts in a two-dimensional Fourier transform, and should preferably be diminished. With the MR imaging apparatus according to this invention, as shown in FIG. 17A, the "waves" are diminished to two, to suppress image blurring artifacts compared with the arrangement shown in FIG. 17C.

Second Embodiment

Next, a case of generating 15 echo signals as shown in FIG. 18 will be described briefly. This is effected by switching the reading gradient field pulses Gr five times in each pulse interval to generate five echo signals in each pulse interval.

The apparatus has the same construction as in the foregoing embodiment. In the pulse sequence shown in FIG. 18, the pulses RF (FIG. 18A) and pulses Gs (FIG. 18B) are the same as in the pulse sequence shown in FIG. 4. These pulses will not be described again. As the basic arrangement, only the case where the reference spin echo signal is "first" in the order within the spin echo group will be described. Next, the case of shifting the basis arrangement to make the reference spin echo signal "last" in the order within the spin echo group will be described.

<"First" in the Order within the Spin Echo Group>
(Basic Arrangement)

As shown in FIG. 18C, the polarity of reading gradient field pulses Gr is switched five times (121a–121e) during the period between 180° pulses 101 and 102, five times (122a–122e) during the next period between 180° pulses 102 and 103, and five times (123a–123e) after 180° pulse 103. As a result, echo signals S1–S5, echo signals S6–S10 and echo signals S11–S15 are generated in the respective pulse intervals (FIG. 18E).

The echo signals S1(GE1), S6(GE5) and S11(GE9) having the same place in the order of generation are called the first gradient echo group SGE1. The echo signals S2(GE2), S7(GE6) and S12(GE 10) are called the second gradient echo group SGE2. The echo signals S4(GE3), S9(GE7) and S14(GE11) are called the third gradient echo group SGE3. The echo signals S5(GE4), S10(GE8) and S15(GE12) are called the fourth gradient echo group SGE4. The phase-encoding gradient field pulses Gp applied to these echo signals are varied as shown in FIG. 18D and FIG. 19A, for example.

A specific phase encoding procedure will be described with reference to FIG. 19A. For the spin echo group SSE, as in the basic arrangement in the first embodiment, the absolute values of the integrated phase encode amounts are successively increased in the order within the spin echo group (two-dot-and-dash lines c1 and c2 in FIG. 19A). For each of the second gradient echo group SGE2 and third gradient echo group SGE3 having gradient echo signals of equal periods of time with respect to the points of time at which the spin echo signals are generated, the absolute values of the integrated phase encode amounts are successively decreased in the order within the gradient echo group (two-dot-and-dash lines b1 and b2 or d1 and d2 in FIG. 19A). For the first gradient echo group SGE1 and fourth gradient echo group SGE4 having gradient echo signals of longer periods of time than the signals in the second and third gradient echo groups SGE2 and SGE3, the direction in which the absolute values of the integrated phase encode amounts change is reversed. That is, the absolute values of the integrated phase encode amounts are increased in the order within each gradient echo group (two-dot-and-dash lines a1 and a2 or e1 and e2 in FIG. 19A).

Figure 19B:
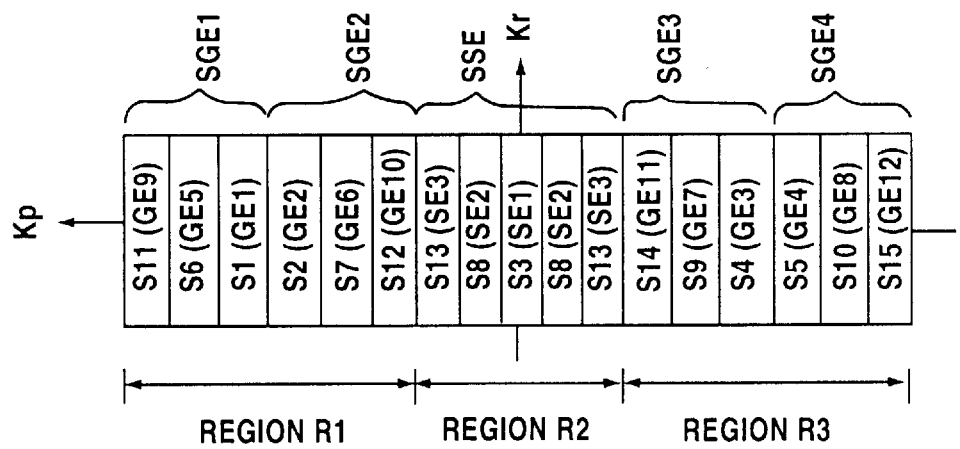
FIGS. 19A and 19B are schematic views showing phase encoding and an arrangement of echo signals in a k-space.
Figure 19A:
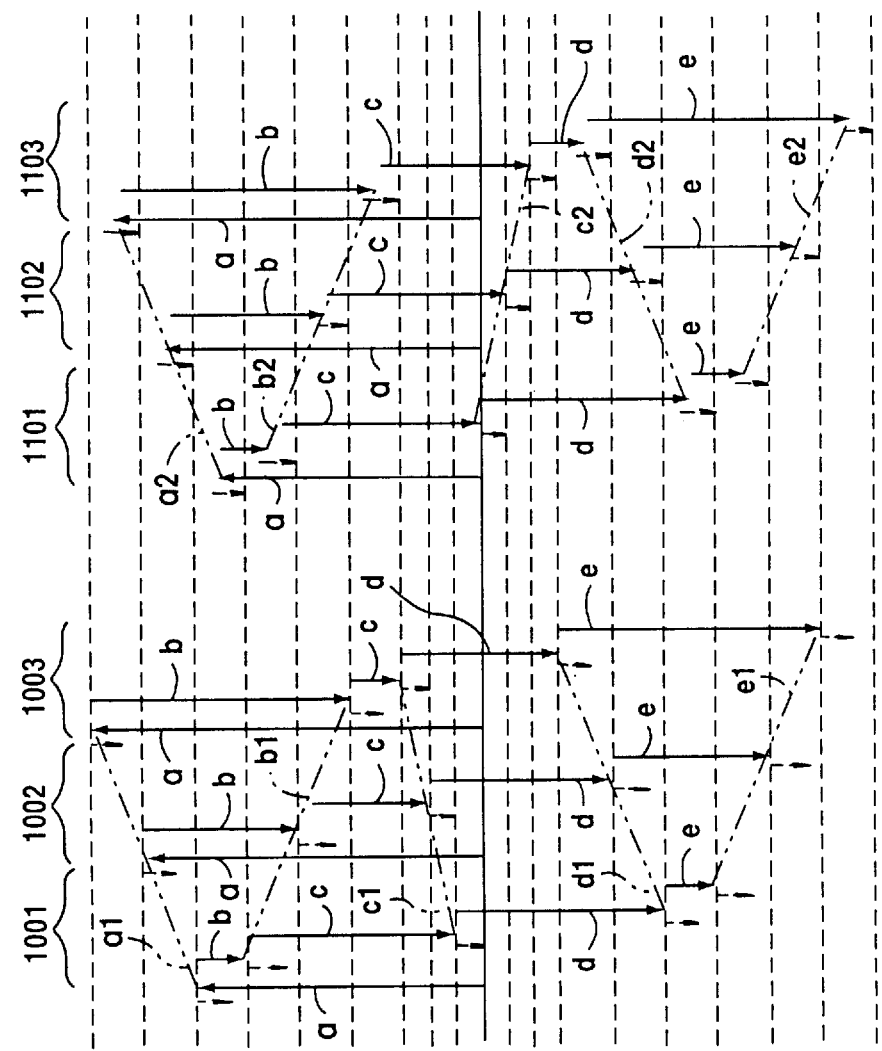

Consequently, as shown in FIG. 19B, the reference spin signal S3(SE1) which is first in the order within the spin echo group is placed in the middle of the spin echo group SSE. FIG. 20 shows signal strengths in this arrangement. As in the basic arrangement in the first embodiment, a reduced difference ΔS1 in signal strength occurs at the boundary between the spin echo group SSE and each of the second gradient echo group SGE2 and third gradient echo group SGE3 at opposite sides.

<"Last" in the Order within the Spin Echo Group>

Next, a case will be described, based on the above arrangement, where the "last" in the order within the spin echo group, i.e. the spin echo signal S13(SE3), is inputted through the designating device 25.

As shown in FIG. 21A, the hatched spin echo signal S13(SE3) situated in the upper position in the spin echo group SSE is shifted downward by n lines. The shift of the spin echo group SSE is the same as in the first embodiment as shown in FIGS. 21B and 21C, and will not be described again.

In the case of the gradient echo groups, the groups having the same periods of time with respect to the points of time at which the spin echo signals S3(SE1), S8(SE2) and S13(SE3) are generated form a pair for shifting purposes. That is, the first gradient echo group SGE1 and fourth gradient echo group SGE4 forms a pair of gradient echo groups. The second gradient echo group SGE2 and third gradient echo group SGE3 form another pair of gradient echo groups. Shifting is made only within each pair of gradient echo groups.

As shown in FIGS. 22A and 22B, the pair of first gradient echo group SGE1 and fourth gradient echo group SGE4 are shifted by twice n lines, i.e. 2n lines (m lines), in the same direction the spin echo group SSE is shifted. The gradient echo signals S11(GE9), S6(GE5) and S1(GE1) less than minimum integrated amount min1 of the first gradient echo group SGE1 are successively arranged after applying thereto new phase encoding corresponding to maximum integrated amount max5 of the fourth gradient echo group SGE4 (FIG. 22B). The gradient echo signals S5(GE4), S10(GE8) and S15(GE12) less than minimum integrated amount min5 of the fourth gradient echo group SGE4 are successively arranged after applying thereto new phase encoding corresponding to maximum integrated amount max1 of the first gradient echo group SGE1 (FIGS. 22C and 22D).

As shown in FIGS. 23A and 23B, the pair of second gradient echo group SGE2 and third gradient echo group SGE3 are shifted by m lines downward. The gradient echo signals S2(GE2), S7(GE6) and S12(GE10) less than minimum integrated amount min2 of the second gradient echo group SGE2 are successively arranged after applying thereto new phase encoding corresponding to maximum integrated amount max4 of the third gradient echo group SGE3 (FIG. 23B). The gradient echo signals S14(GE11), S9(GE7) and S4(GE3) less than minimum integrated amount min4 of the third gradient echo group SGE4 are successively arranged after applying thereto new phase encoding corresponding to maximum integrated amount max2 of the second gradient echo group SGE2 (FIGS. 23C and 23D).

Figure 24A:
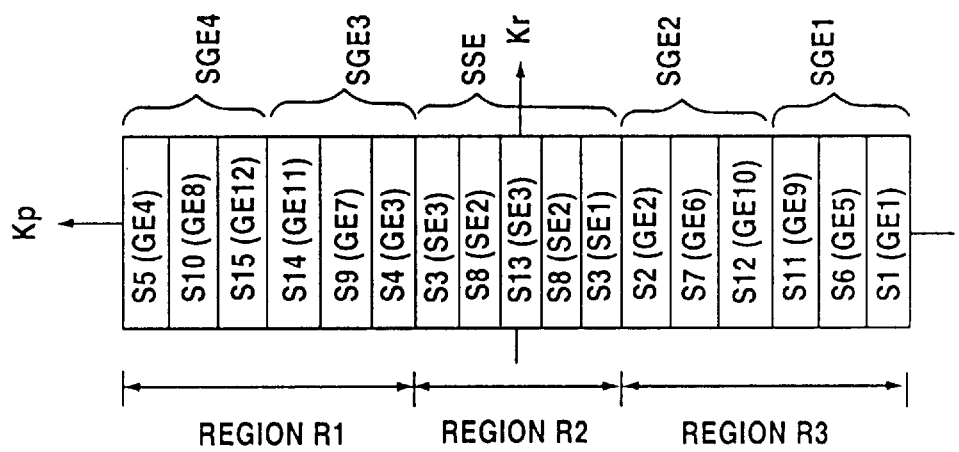
FIGS. 24A and 24B are schematic views showing phase encoding and an arrangement of echo signals in the k-space.
Figure 24B:
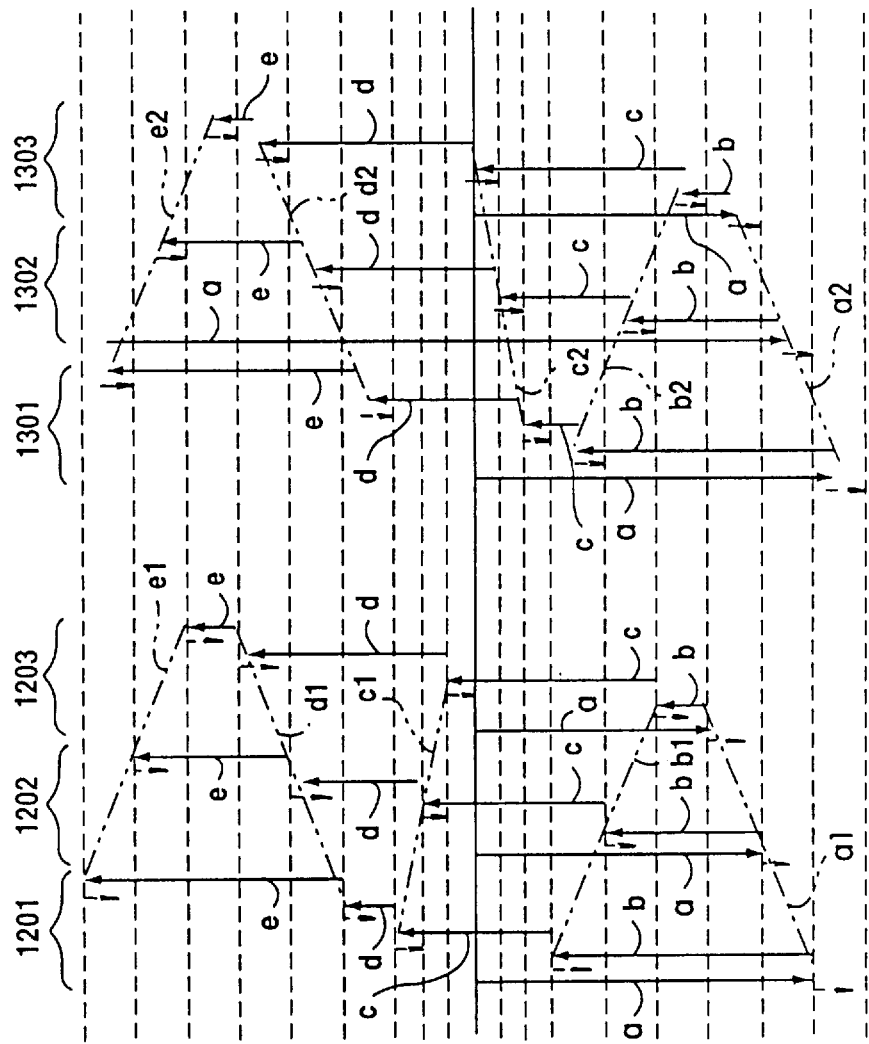

FIG. 24A shows the arrangement of echo signals in the k-space resulting from the above shifts. A specific phase encoding procedure is as shown in FIG. 24B, for example. The signal strengths present a profile as shown in FIG. 25. As in the basic arrangement (FIG. 20), the same reduced difference in signal strength ΔS1 occurs at the boundary between the spin echo group SSE and each of the second gradient echo group SGE2 and third gradient echo group SGE3 at opposite sides. Thus, as in the first embodiment, while suppressing image blurring artifacts, contrast may be adjusted by varying the values relating to the order within the spin echo group.

In this embodiment, as in the first embodiment, a T2-weighted image having an intermediate contrast corresponding to the echo time may be obtained by inputting the spin echo signal S8(SE2) through designating device 25 as a value relating to the order within the spin echo group.

In each of the foregoing embodiments, three refocus RF pulses 101–103 are applied after excitation RF pulse 100, and the polarity of reading gradient field pulses Gr is switched three or five times in each period between the pulses, to generate 9 or 15 echo signals. This invention is not limited to the above number of refocus RF pulses. For example, two refocus RF pulses may be applied to generate a total of six echo signals, or additional refocus RF pulses may be applied to generate an increased number of echo signals. The number of echo signals to be generated may be determined by taking various conditions into account, such as a desired reconstructed image and imaging speed.

The present invention may be embodied in other specific forms without departing from the spirit or essential attributes thereof and, accordingly, reference should be made to the appended claims, rather than to the foregoing specification, as indicating the scope of the invention.

What is claimed is:

1. An MR imaging apparatus using nuclear magnetic resonance (NMR phenomenon), comprising:
   (a) a main magnet for generating a uniform static magnetic field in an imaging space;
   (b) a first, a second and a third gradient field coils for generating three types of gradient field pulses including slice-selecting gradient field pulses, reading gradient field pulses and phase-encoding gradient field pulses, with magnetic strengths varying in three orthogonal directions in said imaging space;
   (c) a RF coil for emitting an excitation RF pulse and a plurality of refocus RF pulses to an object placed in said imaging space and detecting echo signals emerging from said object;
   (d) RF emitting means connected to said RF coil for successively emitting said excitation RF pulse and said refocus RF pulses with predetermined timing through said RF coil;

(e) slice-selecting gradient field pulse generating means for generating said slice-selecting gradient field pulses through said first gradient field coil for selecting slice planes, in timed relationship with said excitation RF pulse and said refocus RF pulses;

(f) reading gradient field pulse generating means for generating, during each of pulse spaces between said refocus RF pulses, a plurality of gradient echo signals distributed across one of spin echo signals by switching polarity a plurality of times, and for generating said reading gradient field pulses through said second gradient field coil in timed relationship with said spin echo signals and said gradient echo signals;

(g) phase-encoding gradient field pulse generating means for generating said phase-encoding gradient field pulses through said third gradient field coil immediately before generation of said echo signals, to effect phase encoding of said echo signals, said phase-encoding gradient field pulse generating means satisfying the following conditions A–F:

A. that said phase-encoding gradient field pulses have varied strengths to vary all of integrated phase encode amounts of said echo signals;

B. that said phase-encoding gradient field pulses have varied strengths to give approximate integrated phase encode amounts to each of a group of said spin echo signals and groups of said gradient echo signals having the same places in an order of generation thereof within said pulse spaces;

C. that said phase-encoding gradient field pulses have varied strengths to give greater absolute values to integrated phase encode amounts of said groups of said gradient echo signals than integrated phase encode amounts of said group of said spin echo signals;

D. that said phase-encoding gradient field pulses have varied strengths to give an integrated phase encode amount adjacent a middle position in said group of said spin echo signals (i.e. spin echo group) to a spin echo signal (i.e. reference spin echo signal) having a particular place in the order of generation within the spin echo group (i.e. order within the spin echo group);

E. that said phase-encoding gradient field pulses have varied strengths such that, where said reference spin echo signal is first or last in the order within the spin echo group, integrated phase encode amounts of said spin echo signals in said group of said spin echo signals have absolute values successively increasing or decreasing from the phase encode amount of said reference spin echo signal according to the order within the spin echo group; and F. that said phase-encoding gradient field pulses have varied strengths such that, where said reference spin echo signal is first or last in the order within the spin echo group, integrated phase encode amounts of said gradient echo signals in said groups of said gradient echo signals (i.e. gradient echo groups) have absolute values successively decreasing or increasing according to the order of generation in said group of said gradient echo signals (i.e. order within the gradient echo groups), a direction in which the absolute values of the integrated phase encode amounts of each of said gradient echo groups change is switched alternately with extension of a period of time from a gradient echo group having the shortest period of time with respect to points of time at which said spin echo signals are generated, and said absolute values are greater than the absolute values of the integrated phase encode amounts of a gradient echo group having a shorter period of time;

(h) designating means for designating a value relating to said order within the spin echo group; and (i) data processing means for collecting data from said echo signals detected by said RF coil, and reconstructing a sectional image by arranging said data in a k-space according to the integrated phase encode amounts of said echo signals.

2. An apparatus as defined in claim 1, wherein said value relating to said order within the spin echo group designated by said designating means is a spin echo number indicative of a place in the order of generation of said spin echo signals.

3. An apparatus as defined in claim 1, wherein said value relating to said order within the spin echo group designated by said designating means is an echo time from said excitation RF pulse, at which a spin echo signal is generated.

4. An apparatus as defined in claim 1, wherein said designating means is operable to designate values relating to first to last in said order within the spin echo group, and said phase-encoding gradient field pulse generating means is operable to apply phase-encoding gradient field pulses to effect phase encoding for each group in a range from the smallest to the greatest integrated phase encode amounts (from a minimum integrated amount to a maximum integrated amount), said phase-encoding gradient field pulse generating means being operable to vary strengths of said phase-encoding gradient field pulses to satisfy the following conditions G and H besides said conditions A–F when the value designated through said designating means relates to an intermediate place in the order:

G. when, in the spin echo group, the integrated phase encode amounts of the spin echo signals are greater than the maximum integrated amount of the spin echo group by a predetermined amount, the smallest of the integrated phase encode amounts is made a new integrated phase encode amount corresponding to the minimum integrated amount of the spin echo group, with increasing integrated phase encode amounts made new integrated phase encode amounts successively increasing from said minimum integrated amount, and the integrated phase encode amounts of a first gradient echo group and a second gradient echo group forming a pair of gradient echo groups having equal periods of time with respect to the points of time at which said spin echo signals are generated are increased by twice said predetermined amount, when the integrated phase encode amounts of the gradient echo signals in the first gradient echo group are greater than the maximum integrated amount of the first gradient echo group, the smallest of the integrated phase encode amounts is made a new integrated phase encode amount corresponding to the minimum integrated amount of the second gradient echo group, with increasing integrated phase encode amounts made new integrated phase encode amounts successively increasing from said minimum integrated amount, and when the integrated phase encode amounts of the gradient echo signals in the second gradient echo group are greater than the maximum integrated amount of the second gradient echo group, the smallest of the integrated phase encode amounts is made a new integrated phase encode amount corresponding to the minimum integrated amount of the first gradient echo group, with increasing integrated phase encode amounts made new integrated phase encode amounts successively increasing from said minimum integrated amount; and H. when, in the spin echo group, the integrated phase encode amounts of the spin echo signals are smaller than the minimum integrated amount of the spin echo group by a predetermined amount, the greatest of the integrated phase encode amounts is made a new integrated phase encode amount corresponding to the maximum integrated amount of the spin echo group, with decreasing integrated phase encode amounts made new integrated phase encode amounts successively decreasing from said maximum integrated amount, and the integrated phase encode amounts of the first gradient echo group and the second gradient echo group forming a pair of gradient echo groups having equal periods of time with respect to the points of time at which said spin echo signals are generated are decreased by twice said predetermined amount, when the integrated phase encode amounts of the gradient echo signals in the first gradient echo group are smaller than the minimum integrated amount of the first gradient echo group, the greatest of the integrated phase encode amounts is made a new integrated phase encode amount corresponding to the maximum integrated amount of the second gradient echo group, with decreasing integrated phase encode amounts made new integrated phase encode amounts successively decreasing from said maximum integrated amount, and when the integrated phase encode amounts of the gradient echo signals in the second gradient echo group are smaller than the minimum integrated amount of the second gradient echo group, the greatest of the integrated phase encode amounts is made a new integrated phase encode amount corresponding to the maximum integrated amount of the first gradient echo group, with decreasing integrated phase encode amounts made new integrated phase encode amounts successively decreasing from said maximum integrated amount.

5. An apparatus as defined in claim 4, wherein said value relating to said order within the spin echo group designated by said designating means is a spin echo number indicative of a place in the order of generation of said spin echo signals.

6. An apparatus as defined in claim 4, wherein said value relating to said order within the spin echo group designated by said designating means is an echo time from said excitation RF pulse, at which a spin echo signal is generated.

7. An apparatus as defined in claim 1, wherein said RF emitting means is operable to control emission timing of an "n"th refocus RF pulse ("n" being a positive integer) to establish;

$$\{2(n-1)+1\}\tau$$

where emission of said excitation RF pulse is regarded as time origin, and $\tau$ is a point of time at which a first one of said refocus RF pulses is emitted.

8. An apparatus as defined in claim 7, wherein said $\tau$ is in a range of 5 to 10 ms.

9. An apparatus as defined in claim 1, wherein said RF emitting means is operable to emit an even number of refocus RF pulses after one excitation RF pulse, and said reading gradient field pulse generating means is operable to switch polarity an odd number of times during each of said pulse spaces between said refocus RF pulses to generate an even number of echo signals.

10. An apparatus as defined in claim 9, wherein said RF emitting means is operable to emit four refocus RF pulses in one pulse sequence, and said reading gradient field pulse generating means is operable to switch polarity three times during each of said pulse spaces between said refocus RF pulses to generate 12 echo signals in one pulse sequence.

* * * * *